(12) United States Patent
Wurtz

(10) Patent No.: US 11,250,830 B2
(45) Date of Patent: Feb. 15, 2022

(54) CIRCUITS, DEVICES AND METHODS RELATED TO MODE-SWITCHING OF AMPLIFIERS

(71) Applicant: SKYWORKS SOLUTIONS, INC., Irvine, CA (US)

(72) Inventor: Michael Jon Wurtz, Lake Oswego, OR (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/926,680

(22) Filed: Jul. 11, 2020

(65) Prior Publication Data

US 2021/0012763 A1  Jan. 14, 2021

Related U.S. Application Data

(60) Provisional application No. 62/872,771, filed on Jul. 11, 2019, provisional application No. 62/881,448, filed on Aug. 1, 2019.

(51) Int. Cl.
| | | |
|---|---|---|
| *G10K 11/175* | (2006.01) | |
| *G10L 25/51* | (2013.01) | |
| *H04R 3/04* | (2006.01) | |
| *H03G 3/30* | (2006.01) | |
| *H03F 3/183* | (2006.01) | |

(52) U.S. Cl.
CPC .......... *G10K 11/1752* (2020.05); *G10L 25/51* (2013.01); *H03F 3/183* (2013.01); *H03G 3/3005* (2013.01); *H04R 3/04* (2013.01); *H03F 2200/03* (2013.01); *H03G 2201/103* (2013.01)

(58) Field of Classification Search
CPC ..... G10K 11/1752; G10L 25/51; H03F 3/183; H03F 2200/03; H03G 3/3005; H03G 2201/103; H04R 3/04
See application file for complete search history.

(56) References Cited

U.S. PATENT DOCUMENTS

| | | | | |
|---|---|---|---|---|
| 6,366,064 B1* | 4/2002 | Reichard | ........... | H02M 7/53873 323/224 |
| 10,044,323 B1* | 8/2018 | He | ...................... | H03F 3/45475 |
| 2002/0186077 A1* | 12/2002 | Jantzi | ..................... | H03G 3/001 330/51 |
| 2010/0201283 A1* | 8/2010 | Kawata | .............. | H05B 45/3725 315/287 |
| 2011/0012674 A1* | 1/2011 | Midya | ..................... | H03F 3/217 330/10 |
| 2015/0030184 A1* | 1/2015 | Yamada | .................. | H03F 1/025 381/120 |

(Continued)

*Primary Examiner* — David L Ton
(74) *Attorney, Agent, or Firm* — Chang & Hale LLP

(57) ABSTRACT

Circuits, devices and methods related to mode-switching of amplifiers. In some embodiments, an audio controller can include a mode state engine configured to receive an enable signal and generate a control signal for controlling a mode transition of an amplifier between a current source mode and a voltage source mode, with the mode transition of the amplifier resulting in an artifact sound. The audio controller can further include an enable component configured to provide the enable signal to the mode state engine based on a masking sound in an audio signal, such that the artifact sound is substantially masked by the masking sound during the mode transition of the amplifier.

20 Claims, 18 Drawing Sheets

(56) References Cited

U.S. PATENT DOCUMENTS

| | | | |
|---|---|---|---|
| 2016/0080865 A1* | 3/2016 | He | H04R 3/00 |
| | | | 381/96 |
| 2017/0338777 A1* | 11/2017 | Anderson | H03F 1/34 |
| 2018/0184388 A1* | 6/2018 | Kam | H04W 52/0238 |
| 2018/0309420 A1* | 10/2018 | La Grou | H03F 3/68 |
| 2020/0343871 A1* | 10/2020 | Gaboriau | H03F 3/217 |

* cited by examiner

CIRCUITS, DEVICES AND METHODS RELATED TO MODE-SWITCHING OF AMPLIFIERS

CROSS-REFERENCE TO RELATED APPLICATION(S)

This application claims priority to U.S. Provisional Application Nos. 62/872,771 filed Jul. 11, 2019, entitled CIRCUITS, DEVICES AND METHODS RELATED TO MODE-SWITCHING OF AMPLIFIERS, and 62/881,448 filed Aug. 1, 2019, entitled CIRCUITS, DEVICES AND METHODS RELATED TO MODE-SWITCHING OF AMPLIFIERS, the disclosure of each of which is hereby expressly incorporated by reference herein in its entirety.

BACKGROUND

Field

The present disclosure relates to mode-switching of amplifiers processing signals such as audio signals.

Description of the Related Art

In many audio applications, sound provided by a speaker results from an audio signal being amplified by an amplifier, and the amplified audio signal being provided to the speaker. When implemented in a portable audio product having a limited power source such as a battery, operating mode of such an amplifier can be changed to allow a longer operating period with the limited power source.

SUMMARY

In some implementations, the present disclosure relates to an audio controller that includes a mode state engine configured to receive an enable signal and generate a control signal for controlling a mode transition of an amplifier between a current source mode and a voltage source mode, with the mode transition of the amplifier resulting in an artifact sound. The audio controller further includes an enable component configured to provide the enable signal to the mode state engine based on a masking sound in an audio signal, such that the artifact sound is substantially masked by the masking sound during the mode transition of the amplifier.

In some embodiments, the enable component can be configured such that the masking sound is selected to be spectrally similar to the artifact sound. The enable component can be configured such that the masking sound is identified based on a comparison of a crest factor of the audio signal and a crest factor threshold level. The crest factor of the audio signal can include a high frequency crest factor. The enable component can include a comparator configured to generate an output based on a comparison of the high frequency crest factor and the crest factor threshold level. The enable component can further include a high pass filter and an absolute value circuit, such that the audio signal passed through the high pass filter and the absolute value circuit provides the high frequency crest factor. The enable component can further include a delay component configured to provide a time delay for the output of the comparator.

In some embodiments, the crest factor of the audio signal can be obtained by a combination of a peak audio level of the audio signal and an average audio level of the audio signal. The crest factor of the audio signal can be obtained by a ratio of the peak audio level over the average audio level. The peak audio level and the average audio level can be obtained from a common frequency range. The common frequency range can include a frequency associated with the artifact sound. The common frequency range can include a high frequency range.

In some embodiments, the peak audio level can be obtained from a first frequency range, and the average audio level can be obtained from a second frequency range that is different than the first frequency range. The first frequency range can include a frequency associated with the artifact sound. The first frequency range can include a high frequency range. The second frequency range can include a frequency range outside of the first frequency range. The second frequency range can include a low frequency range.

In some embodiments, the peak audio level can be obtained by passing the audio signal through a peak level circuit that includes a high pass filter. The peak level circuit can further include an absolute value circuit implemented at an output of the high pass filter.

In some embodiments, the average audio level can be obtained by passing the audio signal through an average level circuit that includes an absolute value circuit. In some embodiments, the average level circuit can further include a low pass filter implemented at an output of the absolute value circuit. In some embodiments, the average level circuit does not include a high pass filter, and the average audio level can be obtained without any high pass filtering of the audio signal.

In some embodiments, the audio controller can further include a target mode component configured to identify a target mode for the mode transition among a plurality of modes including the current source mode and the voltage source mode. The target mode component can be configured such that the target mode is identified based on an average audio signal level and threshold levels associated with the current source mode and the voltage source mode. The threshold levels associated with the current source mode and the voltage source mode can be different. The threshold level associated with the current source mode can be lower than the threshold level associated with the voltage source mode.

In some embodiments, the target mode component can include a comparator configured to generate an output representative of the target mode based on a comparison of the average audio signal level and a selected one of the threshold levels associated with the current source mode and the voltage source mode. In some embodiments, the target mode component can be configured such that the average audio signal level is obtained by passing the audio signal through an absolute value circuit and a low pass filter. In some embodiments, the average audio level can be obtained from a frequency range that is different than a frequency range associated with the artifact sound. The frequency range associated with the artifact sound can include a high frequency range.

In some embodiments, the target mode component can be configured such that the selected one of the threshold levels corresponds to a present mode. The target mode can be the voltage source mode if the present mode is the current source mode, and the average audio signal level is greater than the threshold level corresponding to the current source mode. The target mode can be the current source mode if the present mode is the voltage source mode, and the average audio signal level is less than the threshold level corresponding to the voltage source mode.

In some embodiments, the audio controller can further include a low audio component configured to identify a low audio condition that provides a reduced level of the artifact sound when the mode transition occurs during the low audio condition. The low audio condition can include a zero crossing condition.

In some embodiments, the mode state engine can be further configured to support a change in output resistance of the amplifier in one or more steps. The change in output resistance of the amplifier can be in a plurality of steps. The plurality of steps in the change in output resistance can be implemented by a plurality of respective comparators each generating a respective enable signal as an output based on a first input and a second input, with the first input including a peak audio level of the audio signal, and the second input including an average audio level of the audio signal mixed with a respective threshold value.

In some embodiments, a threshold value associated with an up change involving an increase in the output resistance can be lower than a corresponding threshold value associated with a down change involving a decrease in the output resistance. The mode state engine can be configured to support the change in output resistance of the amplifier in a least number of steps without significantly impacting audibility of the artifact sound. The mode state engine can be configured generate an output signal to effectuate the change in output resistance based on the enable signals of the respective comparators. The output signal can be combined with a zero-crossing indicator signal, such that the change in output resistance is allowed to be effectuated during a zero-crossing event.

In some embodiments, the mode state engine can be configured to enable the change in output resistance in the plurality of steps or in a single step based on a relative strength of the masking sound. The change in output resistance can be implemented in the single step if the relative strength of the masking sound is sufficiently high.

In accordance with a number of implementations, the present disclosure relates to a method for controlling an audio amplifier. The method includes generating an enable signal based on a masking sound in an audio signal. The method further includes controlling a mode transition of the audio amplifier between a current source mode and a voltage source mode based on the enable signal, with the mode transition of the audio amplifier resulting in an artifact sound, and the generating of the enable signal and the controlling of the mode transition achieved such that the artifact sound is substantially masked by the masking sound.

According to some implementations, the present disclosure relates to a semiconductor die that includes a substrate and an audio controller implemented on the substrate. The audio controller includes a mode state engine configured to receive an enable signal and generate a control signal for controlling a mode transition of an amplifier between a current source mode and a voltage source mode, with the mode transition of the amplifier resulting in an artifact sound. The audio controller further includes an enable component configured to provide the enable signal to the mode state engine based on a masking sound in an audio signal, such that the artifact sound is substantially masked by the masking sound during the mode transition of the amplifier.

In some embodiments, the amplifier can be implemented on the substrate.

In some teachings, the present disclosure relates to a packaged module that includes a packaging substrate and an audio controller implemented on the packaging substrate. The audio controller includes a mode state engine configured to receive an enable signal and generate a control signal for controlling a mode transition of an amplifier between a current source mode and a voltage source mode, with the mode transition of the amplifier resulting in an artifact sound. The audio controller further includes an enable component configured to provide the enable signal to the mode state engine based on a masking sound in an audio signal, such that the artifact sound is substantially masked by the masking sound during the mode transition of the amplifier.

In some embodiments, at least the audio controller can be implemented on a semiconductor die.

In a number of implementations, the present disclosure relates to an electronic device that includes an amplifier configured to amplify an audio signal, and an audio controller implemented to control the amplifier. The audio controller includes a mode state engine configured to receive an enable signal and generate a control signal for controlling a mode transition of the amplifier between a current source mode and a voltage source mode, with the mode transition of the amplifier resulting in an artifact sound. The audio controller further includes an enable component configured to provide the enable signal to the mode state engine based on a masking sound in an audio signal, such that the artifact sound is substantially masked by the masking sound during the mode transition of the amplifier.

In some embodiments, the electronic device can be a portable electronic device powered by a battery. In some embodiments, the portable electronic device can be a wireless device.

In some embodiments, the electronic device can further include one or more speakers in communication with the amplifier and configured to generate sound waves based on the amplified audio signal. In some embodiments, the audio controller can be configured to support a mode transition of a respective amplifier associated with each of left and right audio channels at the same time for stereo operation of corresponding left and right speakers.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In many electronic devices such as portable audio products, it is desirable to improve battery life to allow a longer operating period before recharging or replacement of battery. A technique that can be employed is to change the operating mode of an amplifier to, for example, trade fidelity or noise floor for efficiency. For example, a desired performance characteristic of a portable audio device might be to have a high efficiency when program material is high level, but have a lower noise floor when the program material is low.

In many audio products, an issue of clicks or pops is typically known, and often can be problematic, especially if such noises occur during audio playback. Such noises can occur during mode switching operations, and are generally undesirable for a user.

Described herein are various examples related to techniques that allow minimization or reduction of likelihood of audible artifacts being detected by a user. As described herein, such techniques can include what could be considered masking of a noise associated with a mode switching disturbance. In some applications, such a technique can be viewed as preserving signal-to-noise-ratio (SNR) of the sound presented to the user during a mode switching disturbance.

Figure 1:
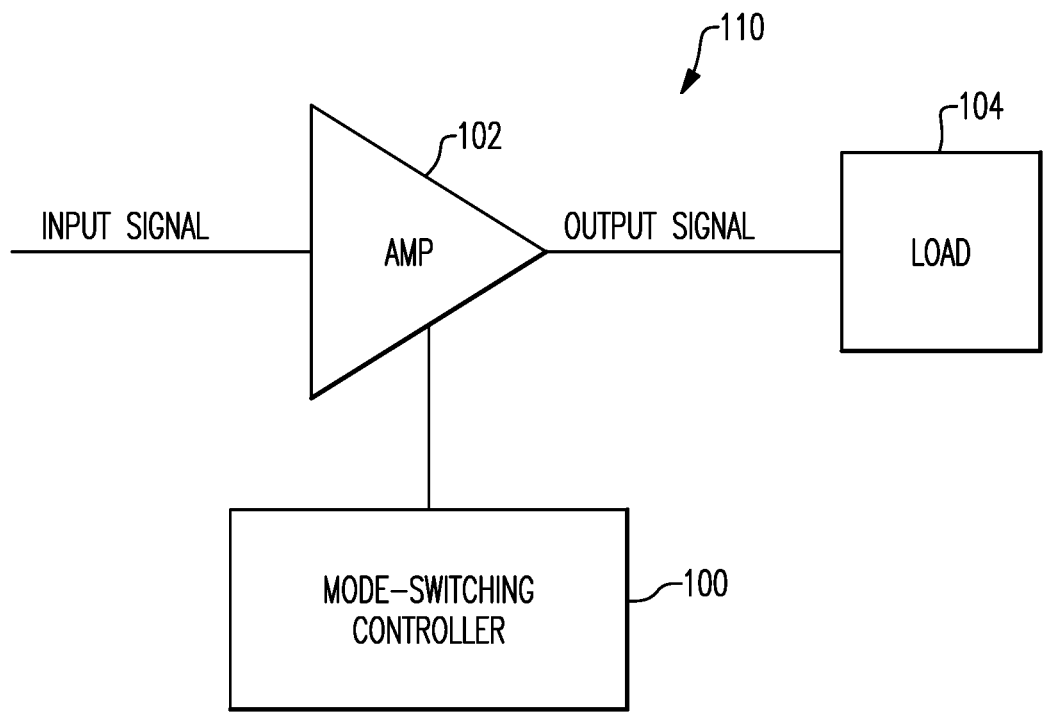
FIG. 1 depicts a signal delivery configuration where an input signal is amplified by an amplifier to generate an amplified output signal.

FIG. 1 depicts a signal delivery configuration 110 where an input signal is amplified by an amplifier 102 to generate an amplified output signal. Such an amplified signal can be provided to a load 104. FIG. 1 further shows that in some embodiments, a mode-switching controller 100 can be provided to control switching between modes of the amplifier 102. Examples related to such control of mode-switching functionality are described herein in greater detail.

Figure 2:
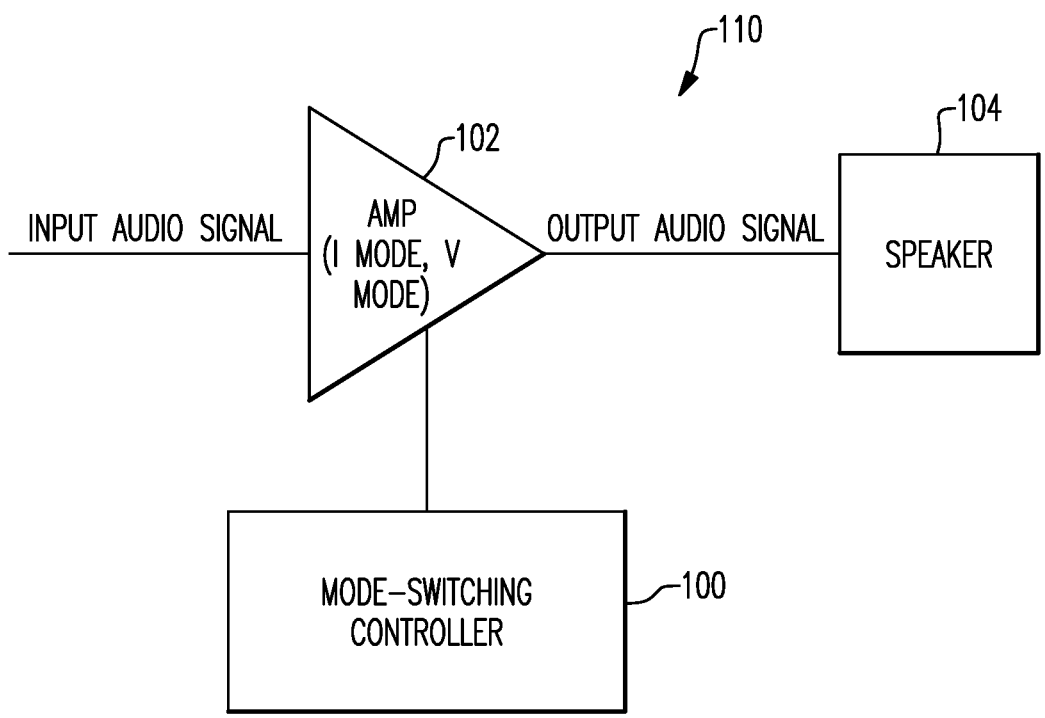
FIG. 2 shows a more specific example of the signal delivery configuration of FIG. 1, in the context of an audio application.

FIG. 2 shows a more specific example of the signal delivery configuration 110 of FIG. 1, in the context of an audio application. Other examples are described herein in the context of such an audio application. Accordingly, it will be understood that while various examples are described in the context of audio applications, one or more features of the present disclosure can also be implemented in other types of signal delivery configurations, including non-audio applications.

Referring to FIG. 2, a signal delivery configuration 110 can be implemented where an input audio signal is amplified by an amplifier 102 to generate an amplified output audio signal. Such an amplified audio signal can be provided to one or more speakers (collectively indicated as 104). FIG. 2 further shows that in some embodiments, a mode-switching controller 100 can be provided to control switching between modes of the amplifier 102. In some embodiments, the amplifier 102 can be implemented as a single amplifier configured to operate in a current source mode (also referred to herein as a current mode or an I mode) or in a voltage source mode (also referred to herein as a voltage mode or a V mode), first and second amplifiers configured to operate in current source and voltage source modes, respectively, or some combination thereof.

It is noted that an amplifier operating in a current source mode results in a lower noise level; thus, such an operating mode is desirable at low audio levels. It is also noted that efficiency of the amplifier operating in the current source mode is less efficient than a similar amplifier operating in a voltage source mode; thus, it is typically desirable to not always operate in the current source mode, in terms of efficiency.

When switching between the current source mode and the voltage source mode, there can be one or more mode-switching issues that result in undesirable sound artifacts.

For example, gain errors can arise during a mode-switching process. In another example, phase errors can arise during a mode-switching process. In yet another example, switching transients can exist during a mode-switching process.

With respect to the gain errors, it is noted that in audio applications, a gain change involving an instantaneous or fast change in gain typically results in a discontinuity proportional to the signal level at or near the instant of switching. Since such a discontinuity is proportional to the signal level, switching of gain at a low signal level (e.g., relative to an average level) is better than switching of gain at a high signal level. In such a context, switching at a zero crossing of a signal is highly desirable and significantly reduces audible transients during a gain change.

Figure 3A:
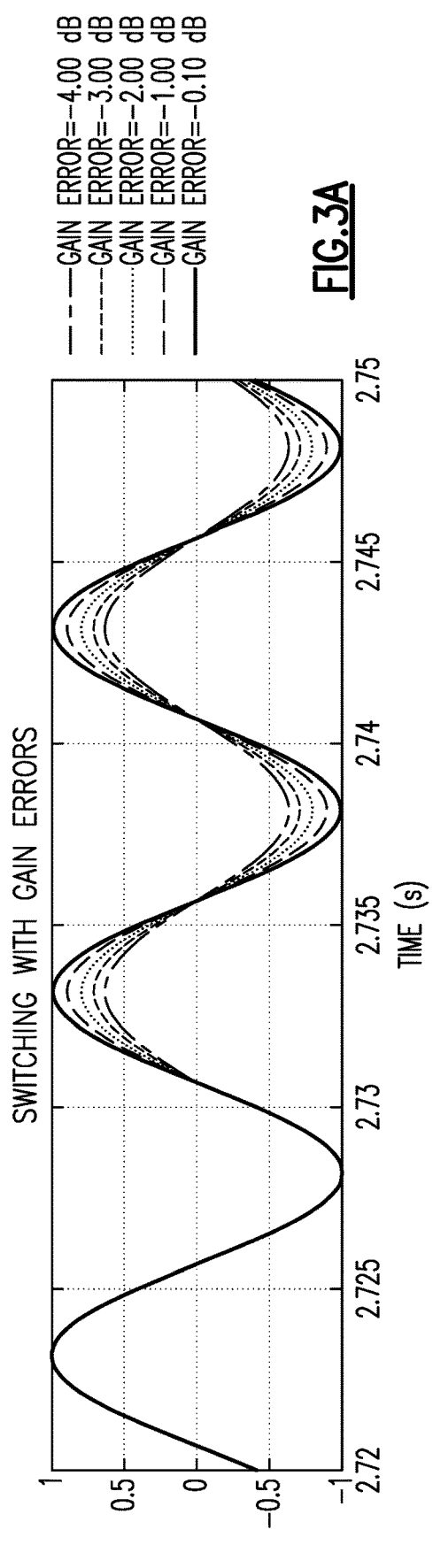
FIG. 3A shows signal traces of a 100 Hz tone before and after a gain change for different gain reductions.
Figure 3B:
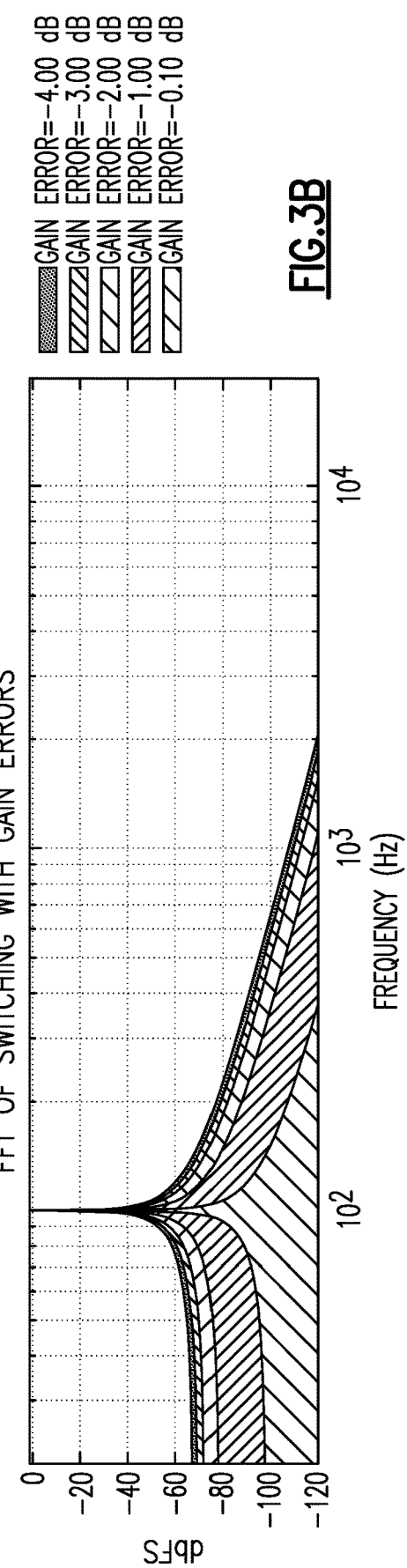
FIG. 3B shows Fast Fourier transforms of the signal traces of FIG. 3A.

FIG. 3A shows signal traces of a 100 Hz tone before and after a gain change soon after 2.73 sec. at one of a number of zero crossings, for gain reduction of 0.10 dB, 1.00 dB, 2.00 dB, 3.00 dB and 4.00 dB. FIG. 3B shows Fast Fourier transforms of the signal traces of FIG. 3A. As discussed above, little or no discontinuity arises if a mode switching occurs at a zero crossing, such as in the example of FIG. 3A. However, and as shown in the example of FIG. 3B, high-frequency spectral roll-off of about −40 dB/decade in gain step is present, thereby resulting in likelihood of audible transients during or near the mode switching operation. In some situations, such audible transients can include, for example, a noticeable timbre change.

Figure 4A:
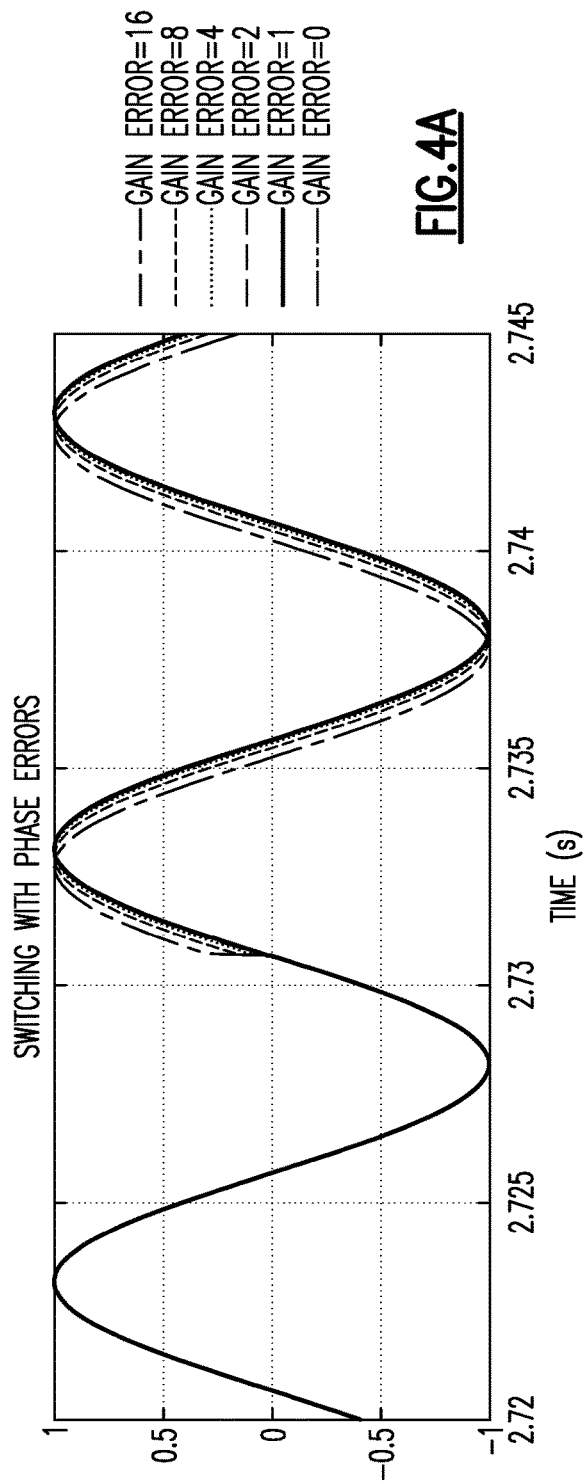
FIG. 4A shows signal traces of a 100 Hz tone before and after a gain change, resulting in various phase changes.
Figure 4B:
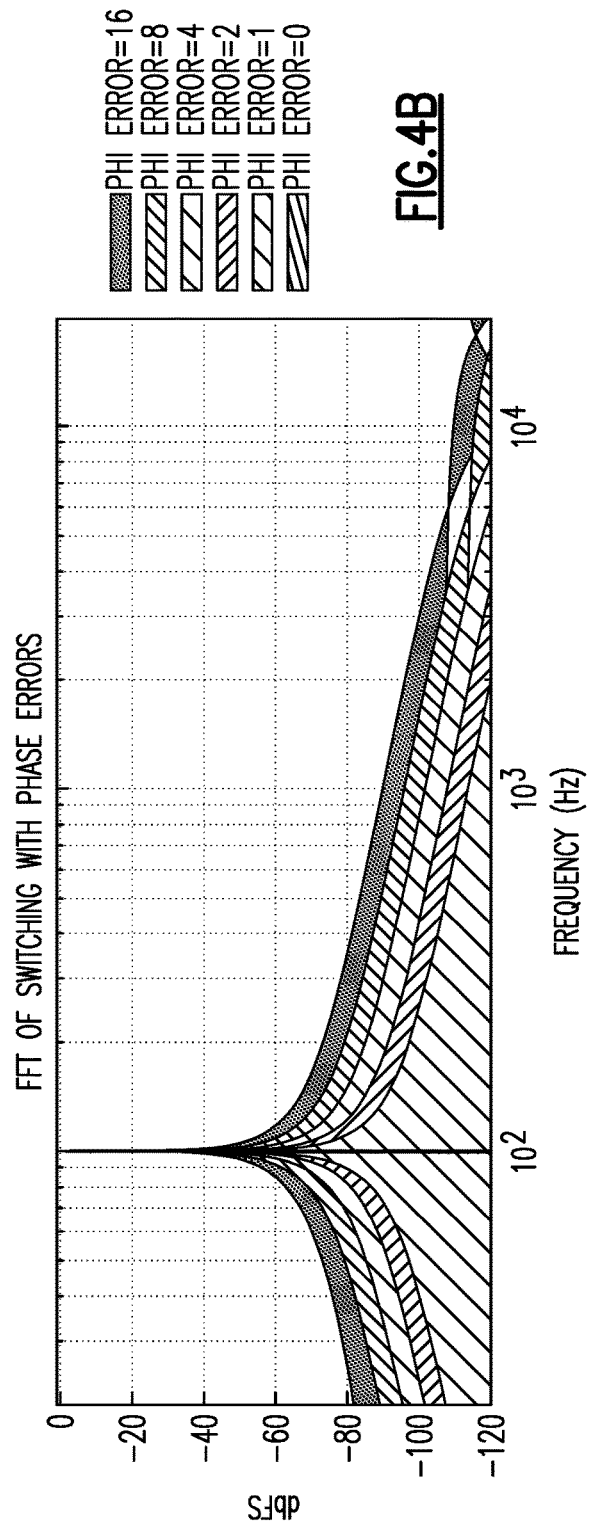
FIG. 4B shows Fast Fourier transforms of the signal traces of FIG. 4A.

FIG. 4A shows signal traces of a 100 Hz tone before and after a gain change soon after 2.73 sec. at a zero crossing (for a signal not undergoing a gain change), resulting in phase changes of 0 degree, 1 degree, 2 degrees, 4 degrees, 8 degrees and 16 degrees. FIG. 4B shows Fast Fourier transforms of the signal traces of FIG. 4A. It is noted that unlike the gain change example, discontinuity in phase arises even if a mode switching occurs at a zero crossing. Further, and as shown in the example of FIG. 4B, high-frequency spectral roll-off of about −20 dB/decade in gain step is present, thereby resulting in higher potential for audible transients during or near the mode switching operation. It is noted that in the example of FIGS. 4A and 4B, phase step disturbance is hard to notice for the 1 degree change; but is readily noticeable for the 4 degree (or higher) change.

Figure 5:
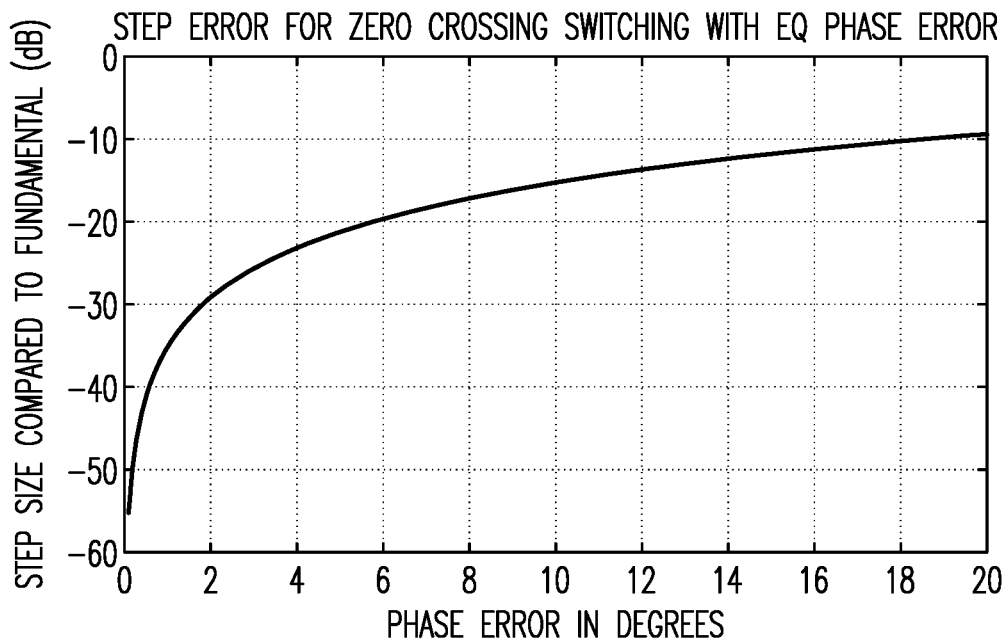
FIG. 5 shows a plot of a glitch magnitude resulting from phase discontinuity as a function of phase change.

As discussed above, a discontinuity in phase arises during a mode switching operation even if the operation occurs at a zero crossing. FIG. 5 shows a plot of such a glitch magnitude resulting from the phase discontinuity as a function of phase change in degrees.

Figure 6:
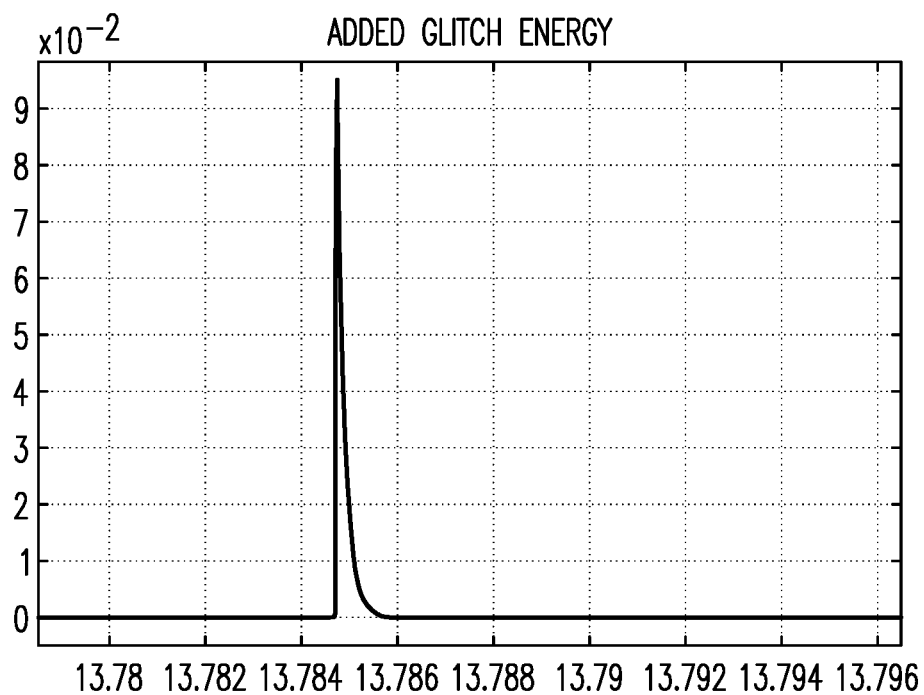
FIG. 6 shows an example plot of glitch magnitude that may arise as a transient glitch.

FIG. 6 shows an example plot of glitch magnitude that may arise as a transient glitch. Such a transient glitch is not related to the signal being amplified, but is produced by other effects such as charge injection, resistor switching, and/or loop settling associated with operation of the amplifier 102 of FIG. 2.

As described herein, a mode switching operation (e.g., between current source mode and voltage source mode) results in one or more discontinuities due to signal components. Such discontinuities typically have associated with them a significant amount of energy at frequencies with large phase errors.

In some embodiments, a mode switching operation can be controlled by reducing the effects of the foregoing discontinuities, and/or by masking an audible event associated with the discontinuities (whether or not the effects are reduced). With the latter, a mode transition may be delayed for a selected condition to provide the masking functionality. Examples of such a selected condition are described herein in greater detail.

In some embodiments, an algorithm can be implemented to tune the foregoing selected condition based mode transition, so as to provide a balance between power usage efficiency and subjective audibility (or masking effectiveness) of the masking functionality.

Figure 7:
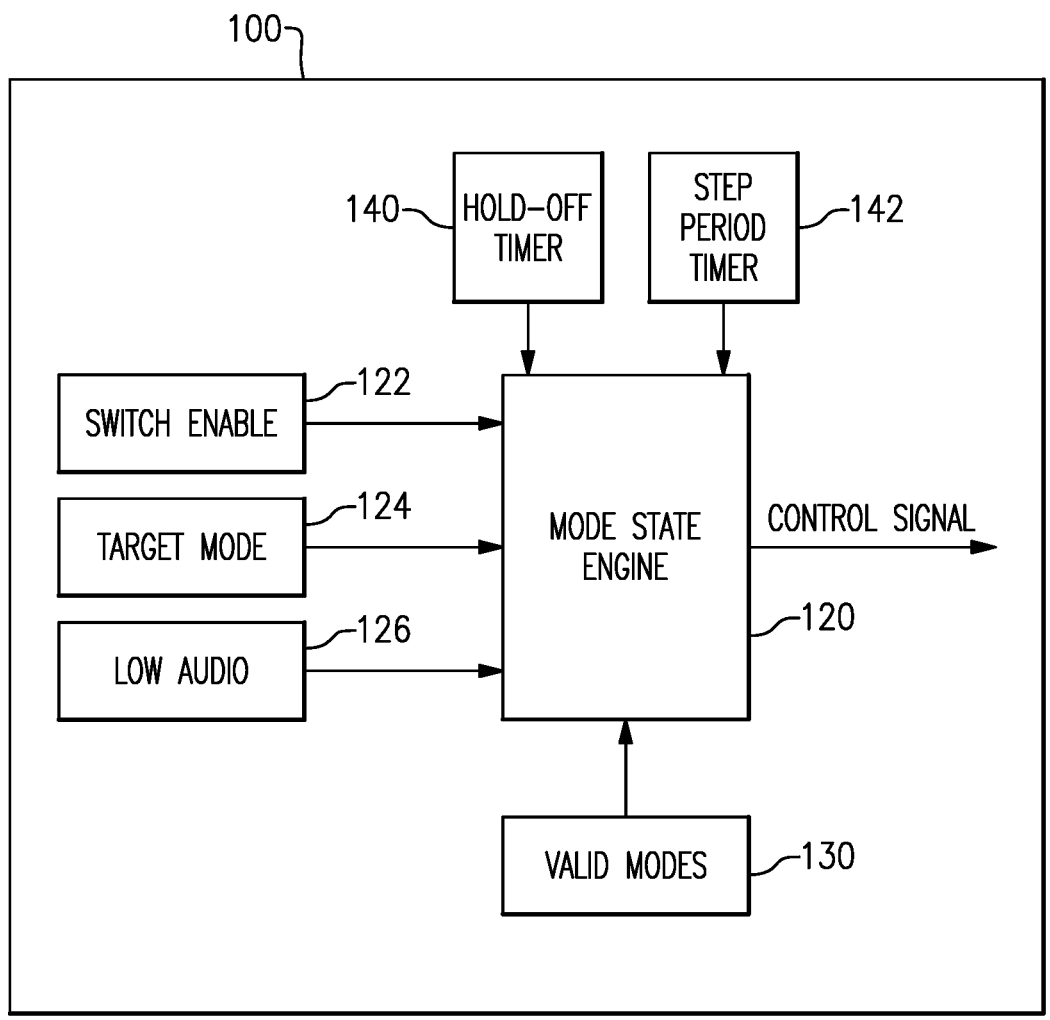
FIG. 7 shows that in some embodiments, a mode-switching controller can include a mode state engine configured to receive a number of inputs and generate a control signal to effectuate a mode-switching operation under a desired condition.

FIG. 7 shows that in some embodiments, a mode-switching controller 100 (such as the mode-switching controller 100 of FIGS. 1 and 2) can include a mode state engine 120 configured to receive a number of inputs and generate a control signal to effectuate a mode-switching operation under a selected condition. For example, a low audio detection component 126 can be implemented to provide an input signal to the mode state engine 120 when an audio signal being amplified is at or near a zero crossing, or has a sufficiently low level. In some embodiments, such an input signal can be utilized to allow a mode-switching operation.

For example, a high logic signal provided by the low audio detection component 126 can correspond to the foregoing zero crossing or sufficiently low audio signal level and be utilized by itself or with one or more other conditions to allow a mode-switching operation. In such a configuration, a low logic signal provided by the low audio detection component 126 can indicate that the audio signal is not at or near a zero crossing, or has a high audio signal level. In some embodiments, such a low logic signal can be utilized to veto any other enabled condition(s), so that a mode-switching operation does not occur. In some embodiments, a mode-switching operation can proceed despite a low logic signal provided by the low audio detection component 126, if one or more selected conditions are satisfied.

Figure 8:
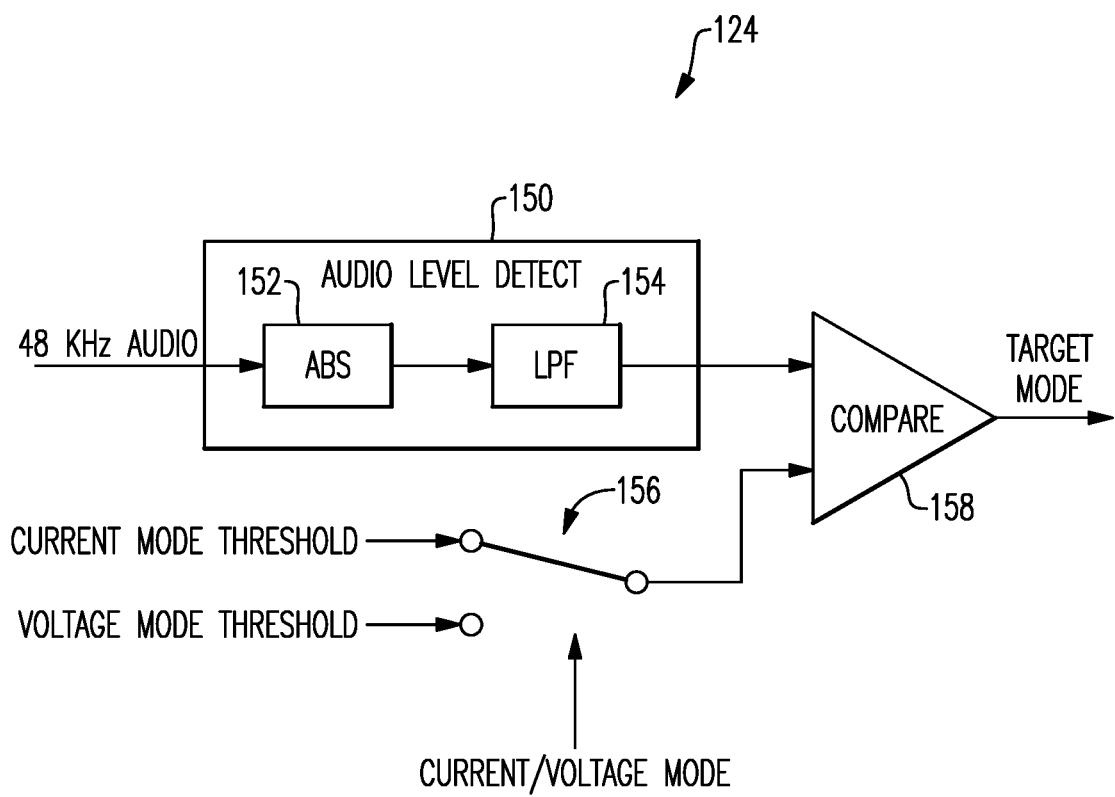
FIG. 8 shows an example of how a target mode determination component of FIG. 7 can be configured.

In another example, and referring to FIG. 7, a target mode determination component 124 can be implemented to provide an input signal to the mode state engine 120. In some embodiments, such component can determine which mode the next transition should be. FIG. 8 shows an example of how the target mode determination component 124 of FIG. 7 can be configured. In FIG. 8, a target mode determination component 124 can include a comparator 158 that compares an average audio signal level (e.g., see the top panels in FIGS. 10A and 10B) with a threshold level (e.g., threshold level T1, T2 or T3 in the top panels of FIGS. 10A and 10B).

By way of an example, the foregoing average audio signal level can be obtained by an audio level detector 150 configured to receive an audio signal (e.g., a 48 KHz audio signal) and obtain an absolute value of the audio signal with an absolute value circuit (ABS) 152. Such an absolute value signal can then be passed through a low pass filter (LPF) 154 to obtain the average audio signal level.

Also by way of an example, the foregoing threshold level can be based on the present mode. In FIG. 8, such a present mode can be utilized to set a switch 156 to obtain and provide to the comparator 158 a threshold value corresponding to the present mode. For example, if the present mode is a current source mode, the switch 156 can be set to obtain and provide to the comparator 158 a current source mode threshold value (T2 in FIGS. 10A and 10B). Similarly, if the present mode is a voltage source mode, the switch 156 can be set to obtain and provide to the comparator 158 a voltage source mode threshold value (T1 in FIGS. 10A and 10B).

With the foregoing inputs to the comparator 158, the following example target mode determination can be implemented in some embodiments. If the present mode is a current source mode, and the average audio signal level is greater than the current source mode threshold value (T2 in FIGS. 10A and 10B), the target mode can be set to be a voltage source mode; otherwise, the target mode can remain as the present mode. If the present mode is a voltage source mode, and the average audio signal level is less than the voltage source mode threshold value (T1 in FIGS. 10A and 10B), the target mode can be set to be a current source mode; otherwise, the target mode can remain as the present mode.

In some embodiments, the foregoing target mode can be utilized to effectuate a masking event induced transition (from the present mode to the target mode). If no attempt is made to transition based on a masking event, then a transition (from the present mode to the target mode) can be made if the low audio component 126 is enabled (e.g., at the next zero crossing), assuming that the target mode is different than the present mode.

In yet another example, and referring to FIG. 7, a switch enable component 122 can be implemented to provide an input signal to the mode state engine 120 when a selected condition is detected. In some embodiments, such a selected condition can include a masking event associated with an audio signal being amplified. By way of non-limiting examples, a masking event can include a sound (e.g., a snare drum sound, a guitar strumming sound, an onset of a phrase, etc.) that can mask, for a listening user, a sound artifact associated with a mode-switching operation.

Figure 9:
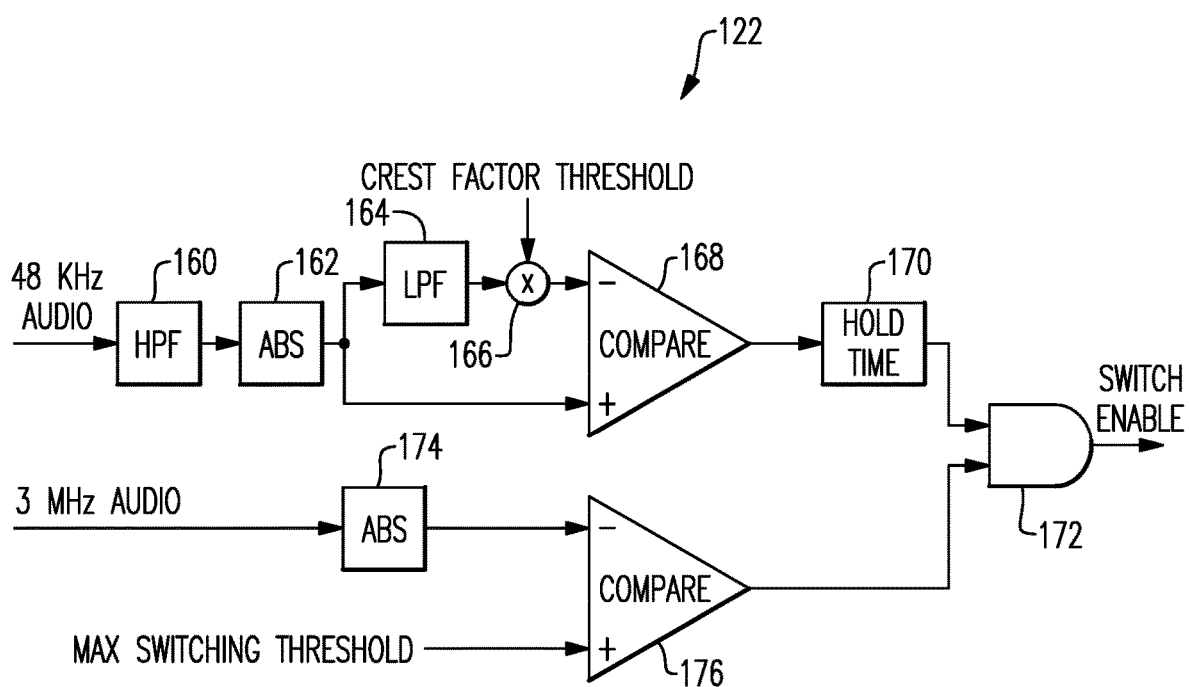
FIG. 9 shows an example of how a switch enable component of FIG. 7 can be configured to identify a masking event.

In some embodiments, a masking event can be identified based on a crest factor (CF) of an audio signal being amplified (e.g., a 48 KHz audio signal). Such a crest factor can be calculated as a ratio of a peak value over an average value. FIG. 9 shows an example of how the switch enable component 122 of FIG. 7 can be configured to identify the foregoing masking event. In FIG. 9, a switch enable component 122 can include a first comparator 168 that compares a high frequency crest factor of an audio signal with a crest factor threshold level (e.g., see the second panels from the bottom in FIGS. 10A and 10B).

By way of an example, the foregoing high frequency crest factor can be obtained by passing an audio signal (e.g., a 48 KHz audio signal) through a high pass filter (HPF) 160, and then obtaining an absolute value of the high pass filtered signal with an absolute value circuit (ABS) 162. In the example of FIG. 9, such an absolute value of the high pass filtered signal is shown to be provided to one of the inputs of the first comparator 168.

Also by way of an example, the foregoing crest factor threshold level can be provided to another of the inputs of the first comparator 168, by mixing (at mixer 166) with a signal obtained from the foregoing absolute value of the high pass filtered signal (output of the ABS circuit 162) passed through a low pass filter 164. In FIG. 9, the first comparator 168 is shown to provide an output based on the comparison of the absolute value of the high pass filtered signal and the crest factor threshold level. In some embodiments, such an output can be a high logic signal if the absolute value of the high pass filtered signal is greater than the crest factor threshold level (thereby indicating a masking event), or a low logic signal otherwise.

In some embodiments, and as shown in the example of FIG. 9, the output of the first comparator 168 can be time delayed by a hold time component 170, and such a time delayed output logic signal can be provided to an input of an AND gate 172. Another input of the AND gate 172 can be provided with an output from a second comparator 176 that compares an absolute value of an upconverted audio signal (e.g., a 3 MHz audio signal obtained by converting the 48 KHz audio signal, passed through an absolute value circuit (ABS) 174) with a maximum switching threshold level. Thus, the AND gate 172 can output a switch enable signal based on the AND logic operation of the delayed output of the first comparator 168 and the output of the second comparator 176. Such a switch enable signal can be high, indicating a presence of a masking event, or low, indicating absence of a masking event.

It is noted that many sounds that are spectrally similar to the discontinuity-induced mode-switching sound (e.g., sound resulting from phase error) have relatively high frequencies. Thus, the foregoing technique of identifying events with masking sounds (e.g., with high pass filtering of an audio signal) results in the masking sounds to be more similar to the discontinuity-induced mode-switching sound. Accordingly, even if a discontinuity-induced mode-switching sound is audible to a listener during a mode-switching operation, a masking sound present during the masking event-triggered mode-switch operation desirably masks the perception of the audible discontinuity-induced mode-switching sound.

In the example of FIG. 7, the mode-switching controller 100 can further include a hold-off timer 140 configured to support the delay functionality (170) described in reference to FIG. 9.

As discussed above, effects of discontinuities during a mode switching operation can be reduced. Performing a mode-switching operation at or close to a zero crossing is an example of such a reduction. A reduction in effects of discontinuities can also be achieved by performing a mode-switching operation in a plurality of output impedance (Rout) changing steps, instead of a single impedance change, between current source and voltage source modes. Such stepped impedance changes between two values typically result in smaller phase errors than a single impedance change between the two values. Thus, in the example of FIG. 7, the mode-switching controller 100 can include a step period timer 142 configured to support the foregoing stepped impedance changes.

In the example of FIG. 7, the mode-switching controller 100 can further include a component 130 configured to provide information about valid modes supported by the mode state engine 120. Such a component can be implemented as, for example, a lookup table, memory, etc.

Figure 10A:
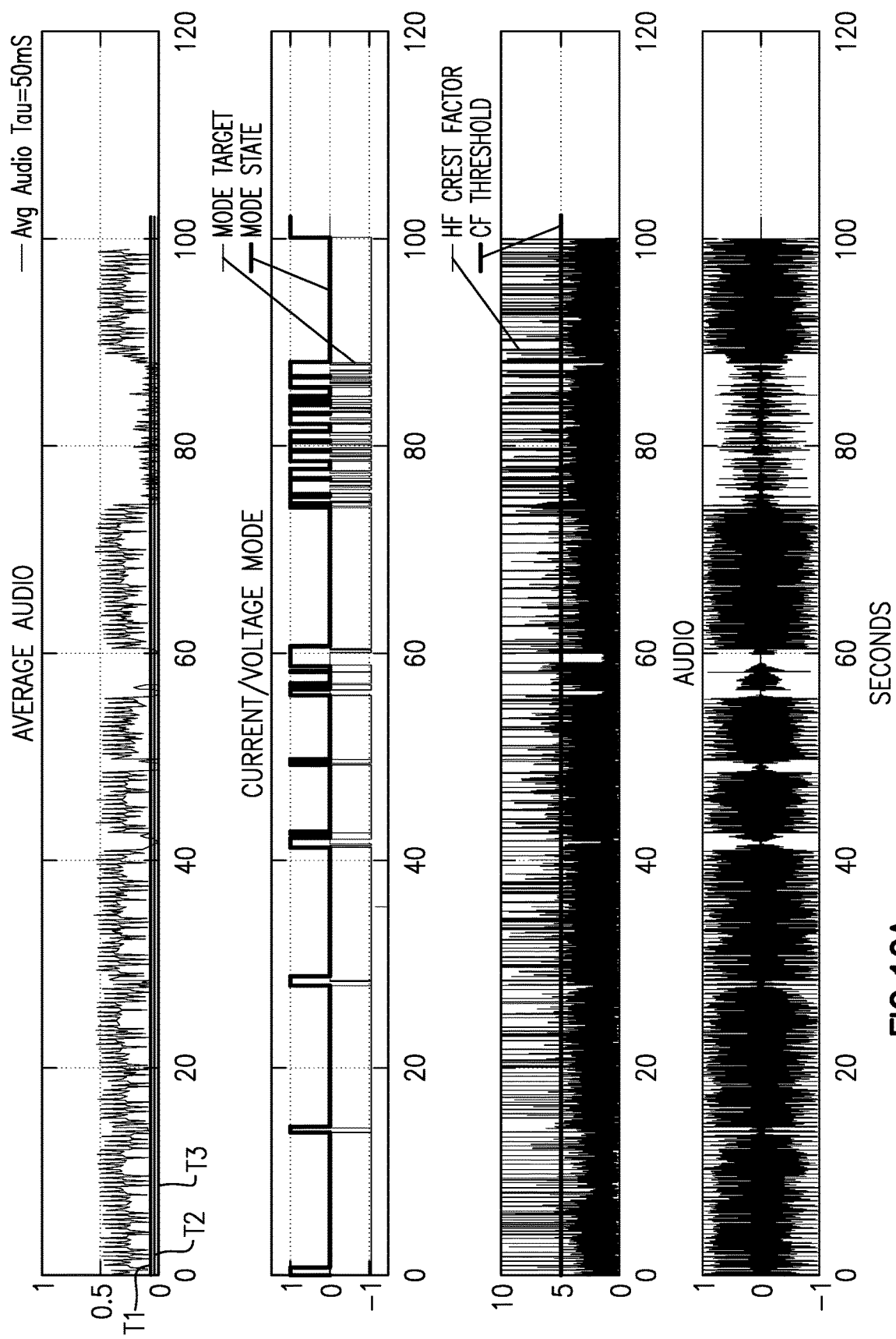
FIG. 10A shows examples of various signals and states associated with an audio signal.
Figure 10B:
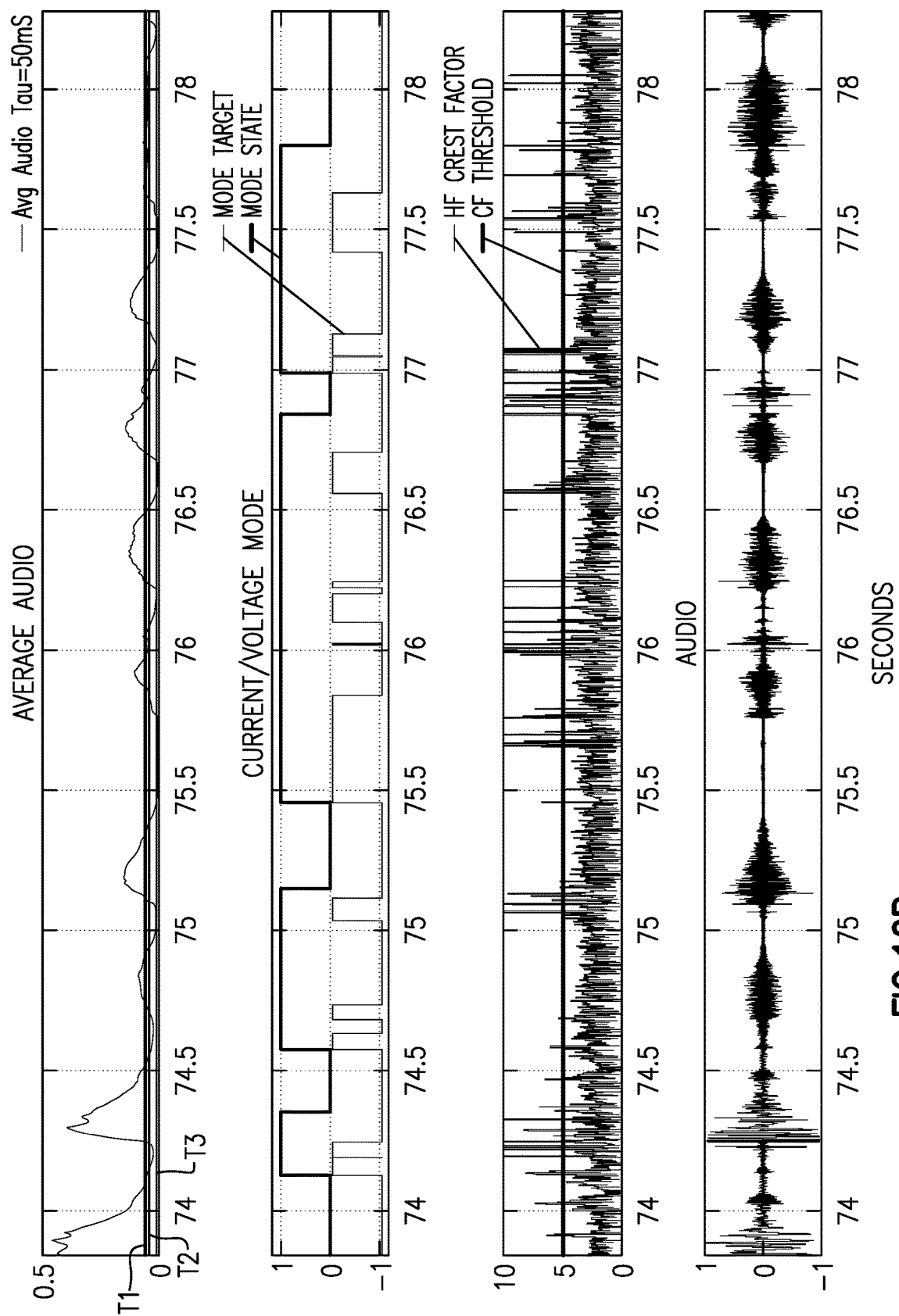
FIG. 10B shows an expanded view of a portion of the example of FIG. 10A.

FIG. 10A shows examples of various signals and states associated with an audio signal. FIG. 10B shows an expanded view of a portion of the example of FIG. 10A. In FIGS. 10A and 10B, the bottom panel shows a normalized audio signal trace. The top panel shows a trace of the average audio signal level associated with the example normalized audio signal trace (of the bottom panel), and various threshold levels (T1, T2, T3) discussed above in reference to FIG. 8. It is noted that T1 corresponds to the voltage source mode threshold value, and such a threshold value can be, for example, 0.060 in the example normalized scale of the average audio signal level. T2 corresponds to the current source mode threshold value, and such a threshold value can be, for example, 0.040 in the normalized scale of the average audio signal level. T3 corresponds to a low audio threshold value, and such a threshold value can be, for example, 0.010 in the normalized scale of the average audio signal level. In some embodiments, T3 can be utilized to identify a low audio condition, including a zero crossing condition.

In FIGS. 10A and 10B, the second panel from the bottom shows a trace of high pass crest factor levels (associated with the example normalized audio signal trace of the bottom panel), and a crest level threshold level, discussed above in reference to FIG. 9. The second panel from the top shows traces of mode states and target modes corresponding to the other traces, as described herein.

As described herein, a masking event can be identified and utilized to mask a sound associated with a mode switching operation. As also described herein, such a masking event can be based on comparison of a crest factor of an audio signal, with the crest factor being calculated as, for example, a ratio of a peak value over an average value associated with the audio signal. In the example of FIGS. 9 and 10 described above, both of peak and average values are obtained from a same pass filtered audio signal (e.g., high pass filtered audio signal), such that both of the peak and average values are based on similar pass component(s) or frequency range(s) of the audio signal (e.g., high pass components).

In some embodiments, it may be desirable to obtain peak and average values that are based on different frequency components or ranges of an audio signal. For example, a peak value can be based on a high pass component to identify sounds such as, for example, snare drum sound, guitar strumming sound, onset of a phrase, etc. that can mask, for a listening user, a sound artifact associated with a mode-switching operation. An average value, however, can be based on a frequency range having a portion outside of a frequency range associated with the high pass component being utilized for the peak value. Such a frequency range for the average value determination may or may not include the frequency range associated with the high pass component.

Figure 11:
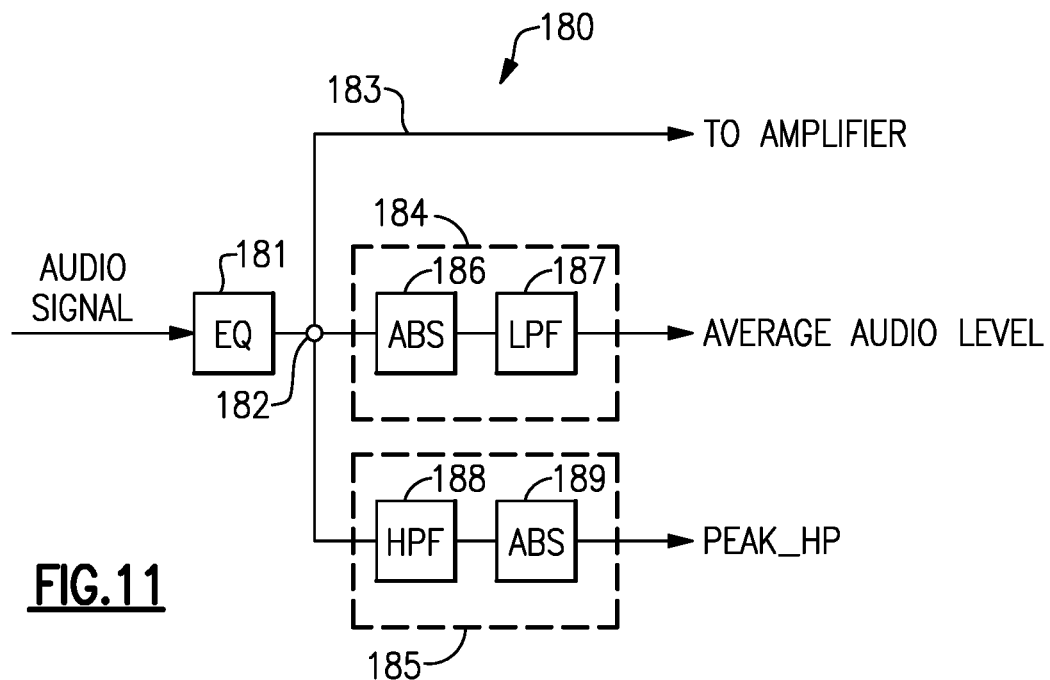
FIG. 11 shows an example of how a switch enable component of FIG. 7 can be configured to identify a masking event based on peak and average values that are based on different frequency components or ranges.

For example, FIG. 11 shows an example of how the switch enable component 122 of FIG. 7 can be configured to identify a masking event based on the foregoing peak and average values that are based on different frequency components or ranges. In FIG. 11, an audio circuit 180 is shown to include a common input node 182 where a common audio signal (e.g., an audio signal processed by an equalizer 181) is provided. From such a common input node, a path 183 can be provided to an amplifier for amplification of the common audio signal. Also from the common input node 182, the common audio signal can be provided to an average level circuit 184 so as to allow determination of an average audio level. Also from the common input node 182, the common audio signal can be provided to a separate peak level circuit 185 so as to allow determination of a peak audio level.

More particularly, and referring to FIG. 11, the peak level circuit 185 can include a high pass filter 188 and an absolute value circuit (ABS) 189 arranged in series. Accordingly, the common audio signal obtained from the common input node 182 and passed through the peak level circuit 185 results in a signal (Peak_HP) having a high pass component or frequency range associated with a sound that is suitable as a masking event.

Also referring to FIG. 11, the average level circuit 184 can include an absolute value circuit (ABS) 186 and a low pass filter 187 arranged in series. Accordingly, the common audio signal obtained from the common input node 182 and passed through the average level circuit 184 results in an average audio signal having a frequency component or range that is different than the frequency component or range associated with the Peak_HP signal. It is noted that in the foregoing example, the common audio signal from the common input node 182 is shown to be provided to the ABS circuit 186 (of the average level circuit 184) without any filtering. In some embodiments, a shaping filter may be provided between the common input node 182 and the ABS circuit 186.

In some embodiments, a crest factor can be obtained from the Peak_HP signal and the average audio level of FIG. 11 (e.g., crest factor=Peak_HP signal level divided by average audio level). In some embodiments, such determination and utilization of the crest factor can be achieved by in a manner similar to the crest factor threshold and the comparator 168 described herein in reference to FIG. 9.

It is noted that the example of FIG. 11 can be advantageous in audio applications where audio material is dominantly low frequency. For such audio material applications, a crest factor that is more representative of the frequency content can be obtained, and an artificially high crest factor metric (even though high frequency masking energy was low) can be avoided.

Figure 12:
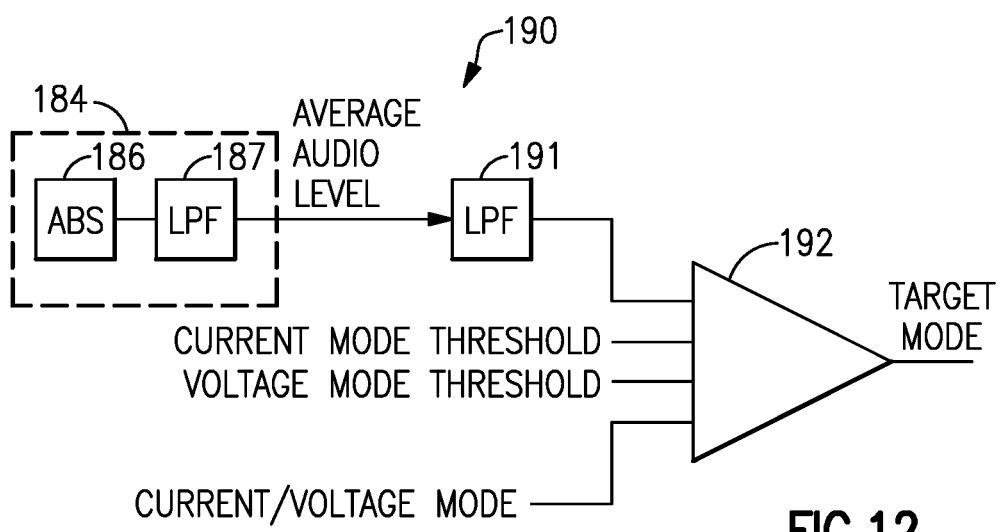
FIG. 12 shows that in some embodiments, an average audio level obtained from an average level circuit of FIG. 11 can be utilized to determine a target mode for a mode switching operation.

FIG. 12 shows that in some embodiments, the average audio level obtained from the average level circuit 184 of FIG. 11 can be utilized to determine a target mode for a mode switching operation, similar to the example of FIG. 8. In FIG. 12, a target mode determination component 190 is shown to receive an average audio level information from an average level circuit 184. In some embodiments, such an average level circuit can be the average level circuit 184 of FIG. 11.

In the example of FIG. 12, the average audio level signal is shown to be passed through another low pass filter 191 and provided to a determination circuit 192. The determination circuit 192 is also shown to be provided with a current mode threshold value, a voltage mode threshold value, and a present mode information (Current/Voltage mode). Similar to the example of FIG. 8, the determination circuit 192 can generate a target mode as an output based on the foregoing inputs. For example, the determination circuit 192 in FIG. 12 can include a comparator and a switch similar to the comparator 158 and the switch 156 of FIG. 8. In such a configuration, the average audio level from the low pass filter 191 can be provided as one of the inputs of the comparator, and the current mode threshold value, the voltage mode threshold value, and the present mode information can be utilized by the switch to provide an appropriate threshold value as the other input of the comparator.

Figure 13:
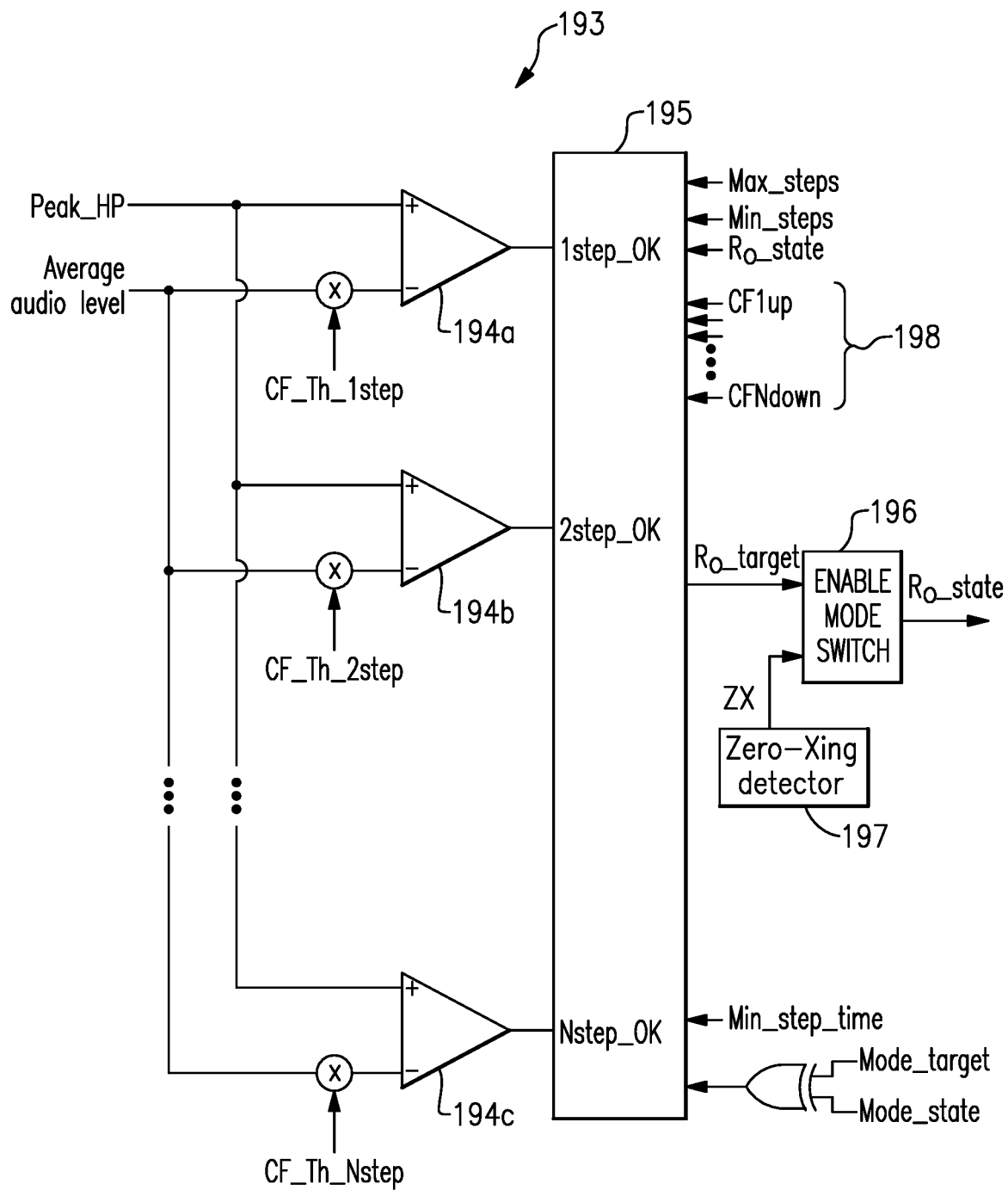
FIG. 13 shows an example of how a mode-switching operation involving a plurality of output impedance changing steps can provide a reduction in effects of discontinuities.

As described above, a mode-switching operation involving a plurality of output impedance (Rout) changing steps can provide a reduction in effects of discontinuities. FIG. 13 shows an example of how such Rout changing steps can be implemented.

Referring to FIG. 13, in some embodiments, a stepped Rout circuit 193 can be implemented to allow a change in output impedance (Rout or Ro) associated with a mode switching operation, in one or more steps. In some embodiments, it may be desirable to provide varying numbers of steps of change in output impedance during different mode switching operations. For example, if a mode switching operation involves, or is likely to involve, a relatively small error (e.g., phase error), such an operation can be carried out with a one-step or a few-step impedance change. In another example, if a mode switching operation involves, or is likely to involve, a relatively large error (e.g., phase error), such an operation can be carried out with a larger number of steps of impedance change.

It is noted that in some embodiments, it may be desirable to skip a plurality of impedance change steps if a masking event is sufficiently strong. In such a situation, the corresponding mode switching operation can be achieved faster while benefitting from the masking effect. Accordingly, in some embodiments, the size of a masking event can drive such logic algorithm instead of the size of error associated with a mode switching operation.

FIG. 13 shows that in some embodiments, the stepped Rout circuit 193 can be configured to determine a number of steps of change in output impedance (Rout or Ro) during a mode switching operation, based on a crest factor (CF). For the purpose of description, it will be understood that such a crest factor can be obtained as in the example of FIG. 9, as in the example of FIG. 11, in another manner, or any combination thereof.

For example, and assuming that the crest factor utilized for the stepped Rout circuit 193 of FIG. 13 is obtained as described in reference to FIG. 11, one can see that a high pass peak level (Peak_HP obtained from the peak level circuit 185 of FIG. 11) and an average audio level (obtained from the average level circuit 184 of FIG. 11) can be provided to each of N comparators (194a, 194b, . . . , 194c). More particularly, the first comparator 194a can be provided with the high pass peak level (Peak_HP) as one input, and the average audio level mixed with a crest factor threshold level for 1-step impedance change (CF_Th_1step) as another input. If Peak_HP is greater than the corresponding threshold value, the comparator 194a can generate an output (1step_OK) indicating at least one step of impedance change is desired.

Similarly, the second comparator 194b can be provided with the high pass peak level (Peak_HP) as one input, and the average audio level mixed with a crest factor threshold level for 2-step impedance change (CF_Th_2step) as another input. If Peak_HP is greater than the corresponding threshold value, the comparator 194b can generate an output (2step_OK) indicating at least two steps of impedance change is desired.

Similarly, the N-th comparator 194c can be provided with the high pass peak level (Peak_HP) as one input, and the average audio level mixed with a crest factor threshold level for N-step impedance change (CF_Th_Nstep) as another input. If Peak_HP is greater than the corresponding threshold value, the comparator 194c can generate an output (Nstep_OK) indicating at least N steps of impedance change is desired.

In the example of FIG. 13, the foregoing outputs of the comparators 194a, 194b, . . . , 194c can be provided to a control circuit 195. Such a control circuit can also be provided with a number of other inputs. For example, a minimum number of allowable or desired steps of impedance change (Min_steps) and a maximum number of allowable or desired steps of impedance change (Max_steps) can be provided as inputs. Such minimum and maximum numbers can be fixed values, programmable values, some combination thereof, etc. In another example, a current output resistance state (Ro_state) can also be provided as an input to the control circuit 195.

In yet another example, a minimum step time (Min_step_time) can be provided as an input to the control circuit 195. Such an input can control timing and/or duration of the stepped changes in the output resistance.

In yet another example, an exclusive-OR (XOR) of target mode (Mode_target) and present mode state (Mode_state) can be provided as an input to the control circuit 195. In some embodiments, such an input can be utilized to ensure that the stepped impedance change be implemented only when the target mode is different than the present mode. For example, if the present mode is a voltage source mode (e.g., Mode_state=1), and the target mode is also a voltage source mode (e.g., Mode_target=1), then there is no need for a mode switch (and the XOR of such two inputs is 0). In another example, if the present mode is a voltage source mode (e.g., Mode_state=1), and the target mode is a current source mode (e.g., Mode_target=0), then a mode switch can proceed (and the XOR of such two inputs is 1). It will be understood that similar logic can also be utilized if the present mode is a current source mode (e.g., Mode_state=0). It is noted that the foregoing feature can allow saving of power by not performing mode switching when the present state and the target state are the same.

In the example of FIG. 13, the control circuit 195 can be configured to generate a control signal Ro_target as an output based on some or all of the foregoing inputs. Such a control signal can include the number of steps to utilized in the output resistance during the corresponding mode switching operation.

FIG. 13 shows that in some embodiments, the control signal Ro_target output from the control circuit 195 can be combined with a zero-crossing signal (ZX) by an enable mode switch circuit 196. Such a zero-crossing signal (ZX) can be indicative of a zero-crossing condition (or near a zero-crossing condition) detected by a zero-crossing detector 197. In some embodiments, the enable mode switch circuit 196 can be configured to allow implementation of the mode switching operation with the stepped output resistance change indicated by the control signal Ro_target. In the example of FIG. 13, the zero-crossing enabled mode switching operation is shown to be enabled by a zero-crossing enabled control signal Ro_state provided by the enable mode switch circuit 196. It is noted that in some embodiments, the foregoing zero-crossing enable feature may or may not be implemented.

In some embodiments, the control circuit 195 can be configured such that the control signal Ro_target is generated to enable an output resistance change with the smallest number of step(s) (with the corresponding step size) acceptable among the various crest factor threshold levels (CF_Th_1step to CF_Th_Nstep) to provide efficiency in the corresponding mode switching operation without significantly impacting audibility of the mode switching sound. Such efficiency can include, for example, a quicker transition between the current and voltage source modes.

Figure 14:
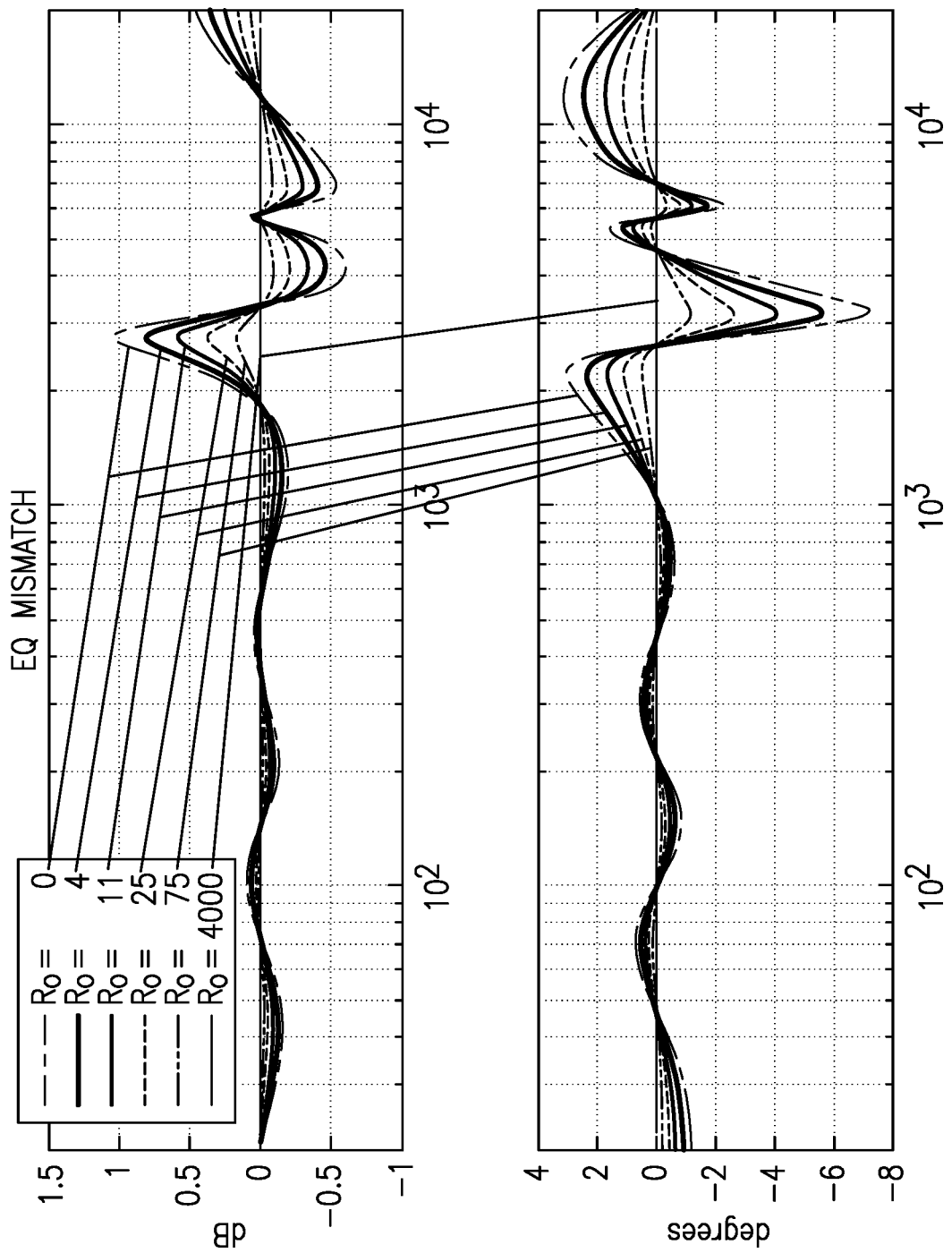
FIG. 14 shows plots of gain errors and phase errors for a mode switching operation, for different numbers of steps of output resistance change.

FIG. 14 shows plots of gain errors (upper panel) and phase errors (lower panel) for a mode switching operation, for different numbers of steps of output resistance change. One can see that a large number of steps (e.g., N=4000) results in essentially no errors, and a no-step change (N=0) results in relatively large errors. One can also see that with a relatively small number of steps, including several steps such as N=4, errors can be reduced significantly when compared to the no-step resistance change. With such a relatively small number of steps, errors can be reduced while allowing the mode switching operation to be achieved in a relatively quick manner.

In some embodiments, when an output impedance (also referred to herein as an output resistance) change is implemented in N steps during a mode switching operation, a corresponding disturbance has a reduced normalized value that is roughly 1/N.

It is noted that in a voltage source mode, the corresponding output resistance is approximately zero or very low. In contrast, in a current source mode, the corresponding output resistance is relatively high. Accordingly, a mode switching operation from a voltage source mode to a current source mode involves a resistance change from a low value to a high value. In contrast, a mode switching operation from a current source mode to a voltage source mode involves a resistance change from a high value to a low value.

In some embodiments, a resistance change from a low value (voltage source mode) to a high value (current source mode) (also referred to as an up resistance change) can be substantially the same as, or be different than, a resistance change from a high value (current source mode) to a low value (voltage source mode) (also referred to as a down resistance change). For example, the crest factor threshold levels (CF_Th_1step to CF_Th_Nstep in FIG. 13) for an up resistance change can all be the same, all be different, or partially the same and partially different, as/than a down resistance change. In the example of FIG. 13, inputs collectively indicated as 198 can be utilized to accommodate the foregoing crest factor threshold levels. Such threshold levels can be utilized as inputs to their respective comparators (194).

In some embodiments, a crest factor threshold for an up resistance change (associated with a switch from a voltage source mode to a current source mode) can be selected to be lower than a corresponding crest factor threshold for a down resistance change (associated with a switch from a current source mode to a voltage source mode). Such a configuration can improve efficiency of the corresponding mode switching operation, especially when implemented with the stepped resistance change as described herein.

In some embodiments, the control circuit 195 of FIG. 13 can be implemented as a part of the mode state engine 120 of FIG. 7, as a separate control circuit, or some combination thereof. Similarly, each of the related components such as the XOR gate, the zero-crossing detector 197 and the enable mode switch circuit 196 can also be as a part of the mode state engine 120 of FIG. 7, as a separate control circuit, or some combination thereof.

Figure 15A:
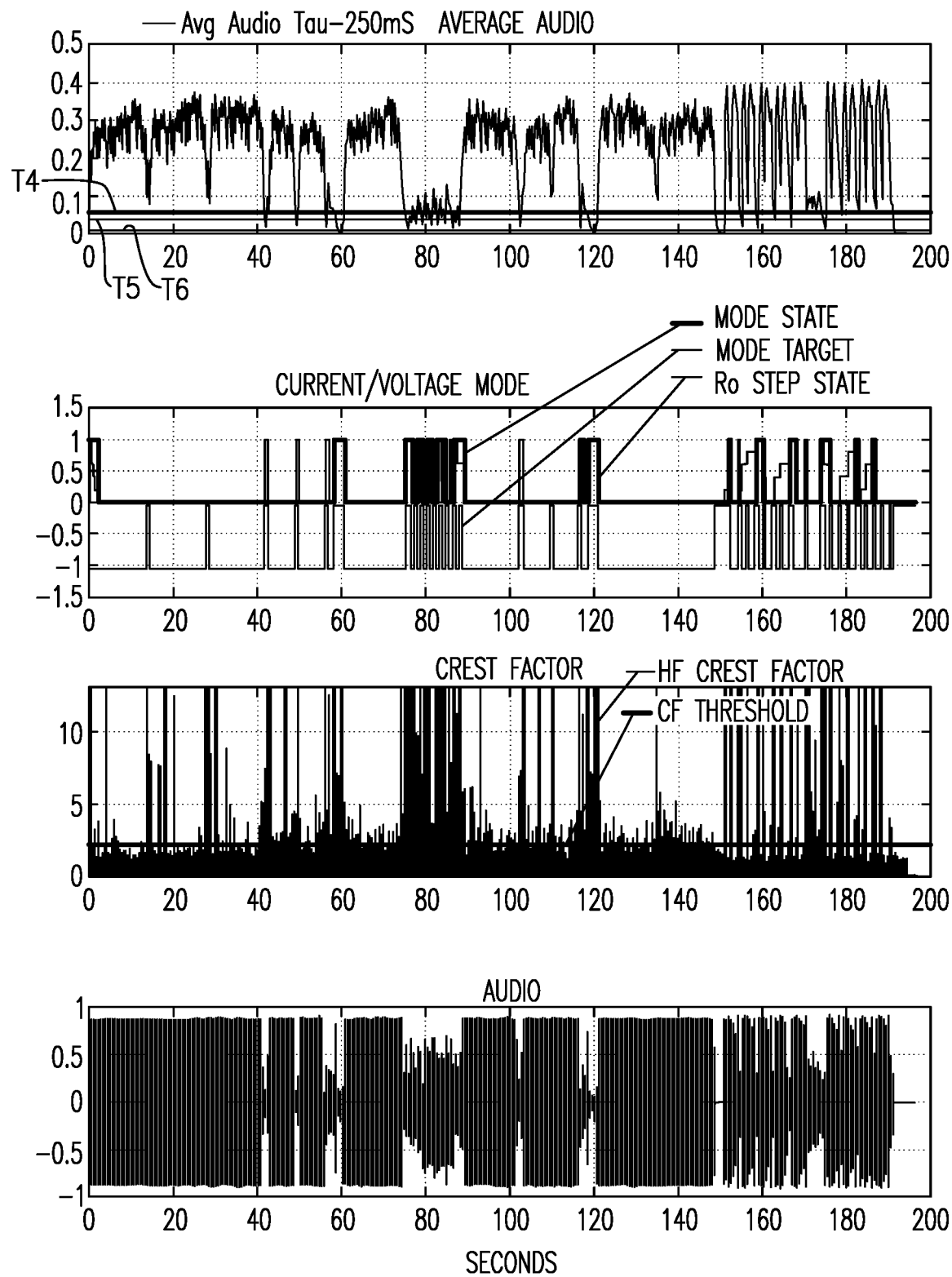
FIG. 15A shows examples of various signals and states associated with an audio signal.
Figure 15B:
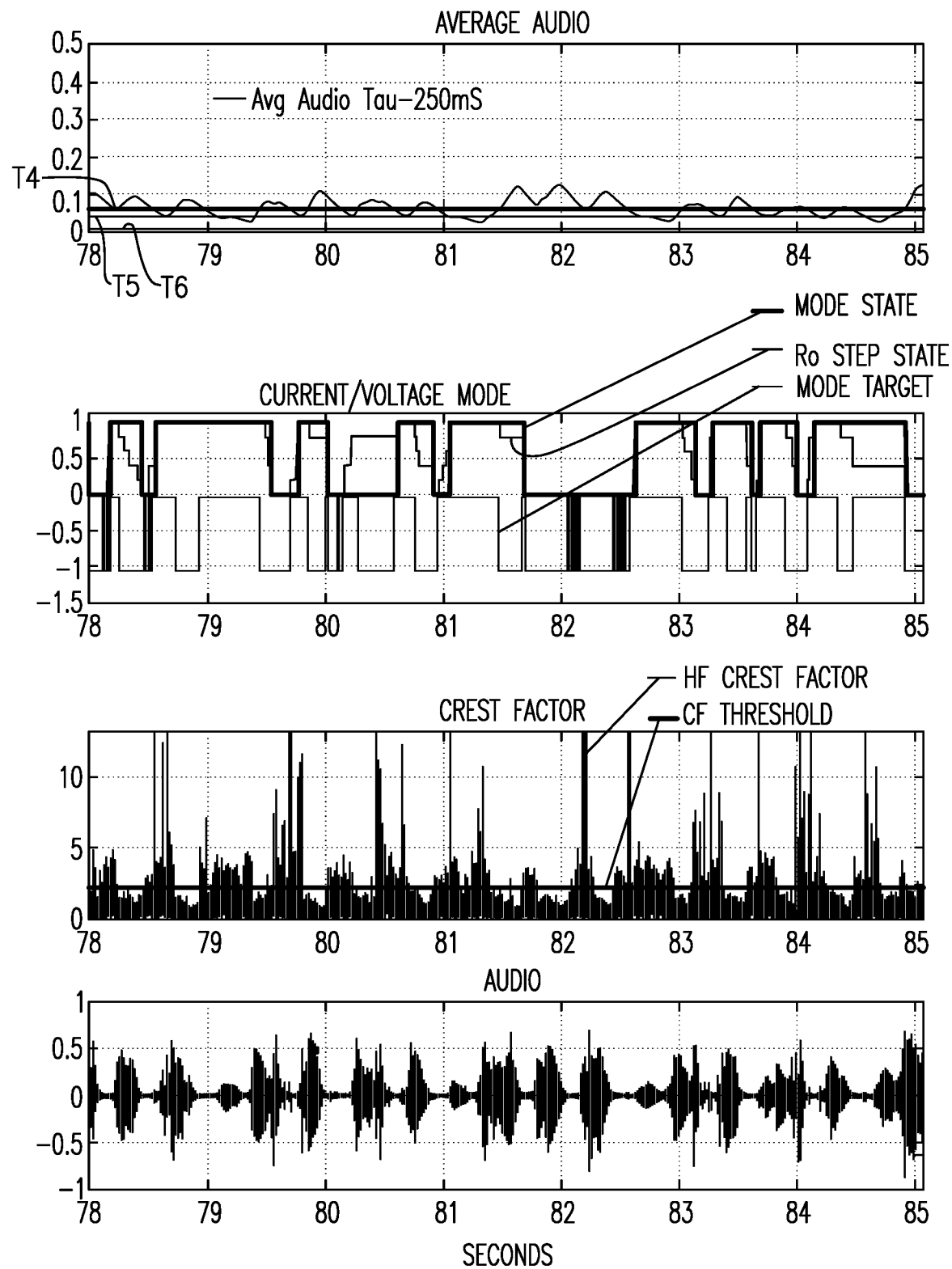
FIG. 15B shows an expanded view of a portion of the example of FIG. 15A.

FIG. 15A shows examples of various signals and states associated with an audio signal. FIG. 15B shows an expanded view of a portion of the example of FIG. 15A. In FIGS. 15A and 15B, the bottom panel shows a normalized audio signal trace. The top panel shows a trace of the average audio signal level and various threshold levels (T4, T5, T6) discussed above in reference to FIGS. 11-13. It is noted that T4 corresponds to the voltage source mode threshold value, and such a threshold value can be, for example, 0.060. T5 corresponds to the current source mode threshold value, and such a threshold value can be, for example, 0.040. T6 corresponds to a low audio threshold value, and such a threshold value can be, for example, 0.010. In some embodiments, T6 can be utilized to identify a low audio condition, including a zero crossing condition.

In FIGS. 15A and 15B, the second panel from the bottom shows a trace of high pass crest factor levels and a crest factor threshold level, discussed above in reference to FIGS. 11-13. The second panel from the top shows traces of mode states and target modes corresponding to the other traces, as described herein.

Figure 16A:
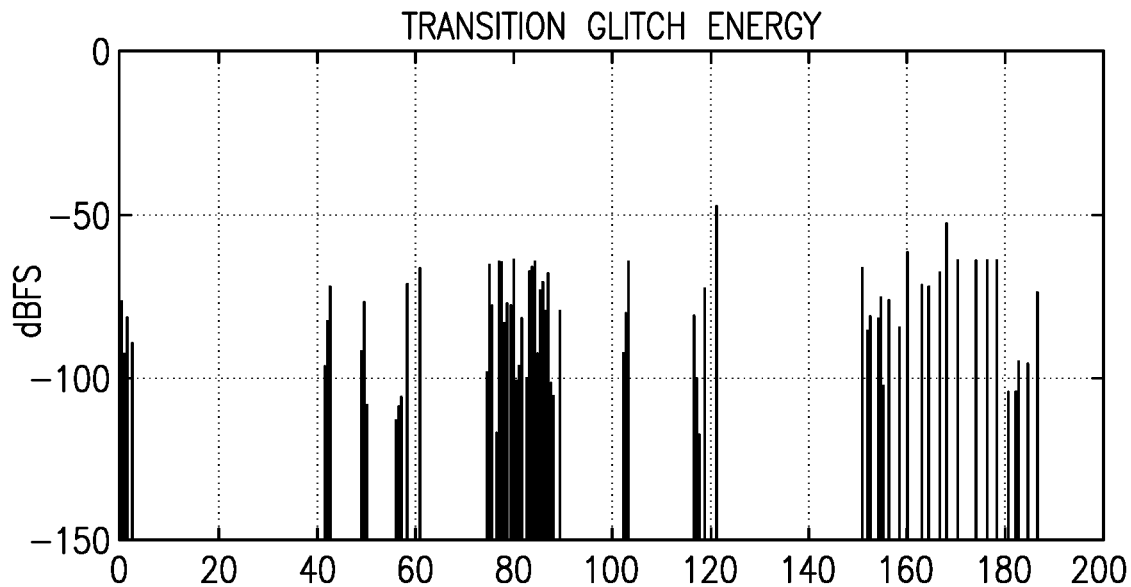
FIG. 16A shows a plot of glitch energy of step changes caused by phase mismatch, for the example audio signal and various traces of FIG. 15A.
Figure 16B:
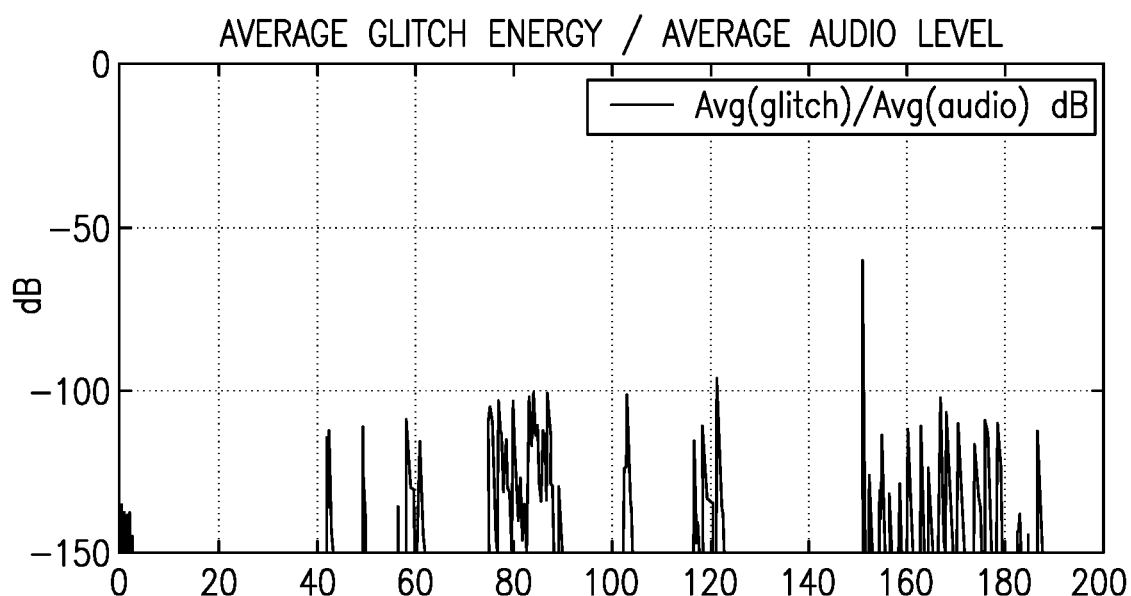
FIG. 16B shows a plot where the glitch energy plot is divided by the corresponding average audio level trace.

FIG. 16A shows a plot of glitch energy of step changes caused by phase mismatch (which dominates the audible artifact), for the example audio signal and various traces of FIG. 15A. FIG. 16B shows a plot where the glitch energy plot is divided by the corresponding average audio level trace. One can see that in either of the two plots of FIGS. 16A and 16B, the glitches are not audible.

In various examples described herein, sound levels such as average audio level and peak level are utilized by one or more features of the present disclosure, and related circuits such as absolute value circuits are configured to process such sound levels. It will be understood that one or more features of the present disclosure can also be implemented utilizing other forms of representation of sound. For example, instead of using an average level to determine a current source/voltage source target mode, similar determination can also be achieved using average energy. With such an example implementation, a square block can be utilized instead of an absolute value block.

Figure 17:
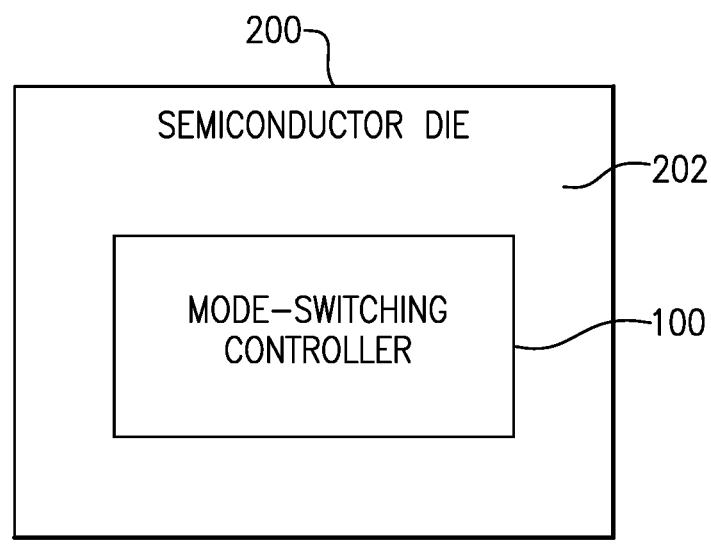
FIG. 17 shows that in some embodiments, a mode-switching controller having one or more features as described herein can be implemented on a semiconductor die.

In some embodiments, a mode-switching controller having one or more features as described herein can be implemented in a number of products. For example, FIG. 17 shows that in some embodiments, a mode-switching controller 100 having one or more features as described herein can be implemented on a semiconductor die 200 having a substrate 202. In such a configuration, the mode state engine 120 of FIG. 7 can be implemented on the substrate 202 of the die 200, and some or all of the various components can also be implemented on the same substrate.

Figure 18:
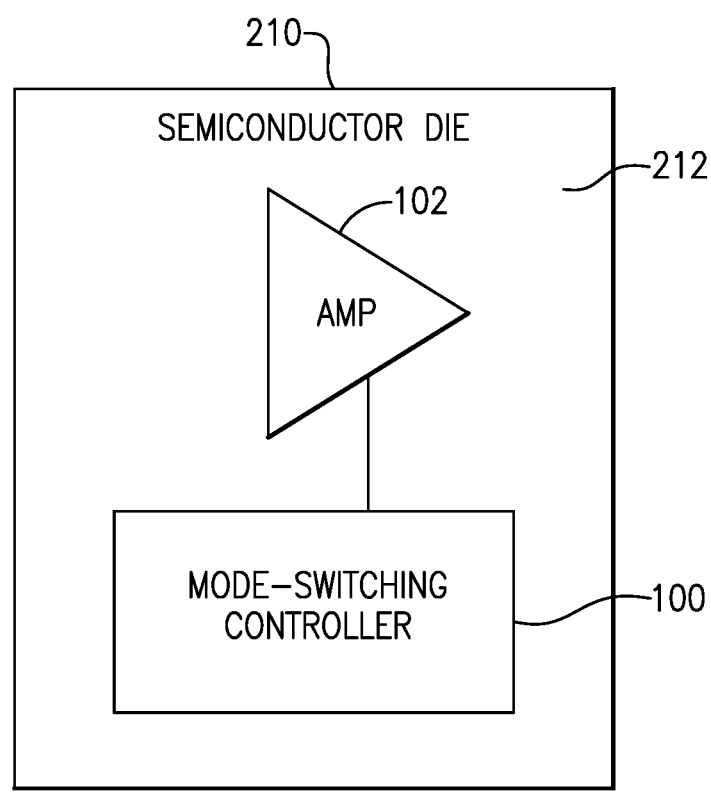
FIG. 18 shows that in some embodiments, a mode-switching controller having one or more features as described herein can be implemented on a semiconductor die that also includes some or all of an amplifier for which mode-switching can be implemented as described herein.

FIG. 18 shows that in some embodiments, a mode-switching controller 100 having one or more features as described herein can be implemented on a semiconductor die 210 having a substrate 212. Such a die can also include some or all of an amplifier 102 for which mode-switching can be implemented as described herein.

Figure 19:
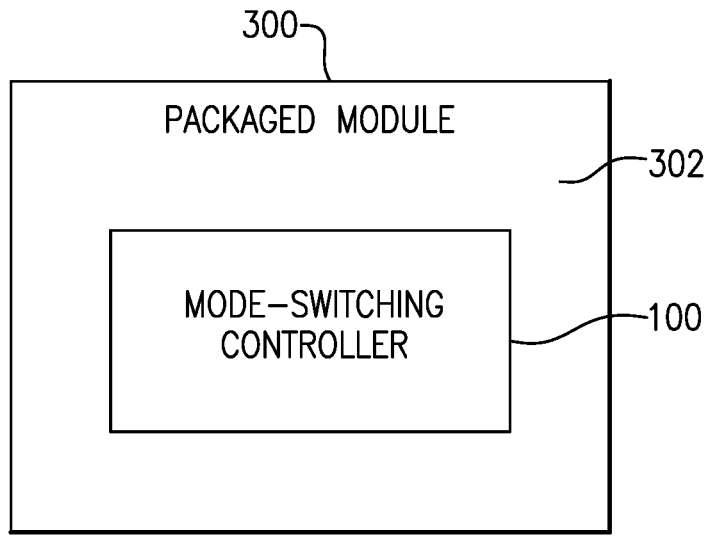
FIG. 19 shows that in some embodiments, a mode-switching controller having one or more features as described herein can be implemented on a packaged module.
Figure 20:
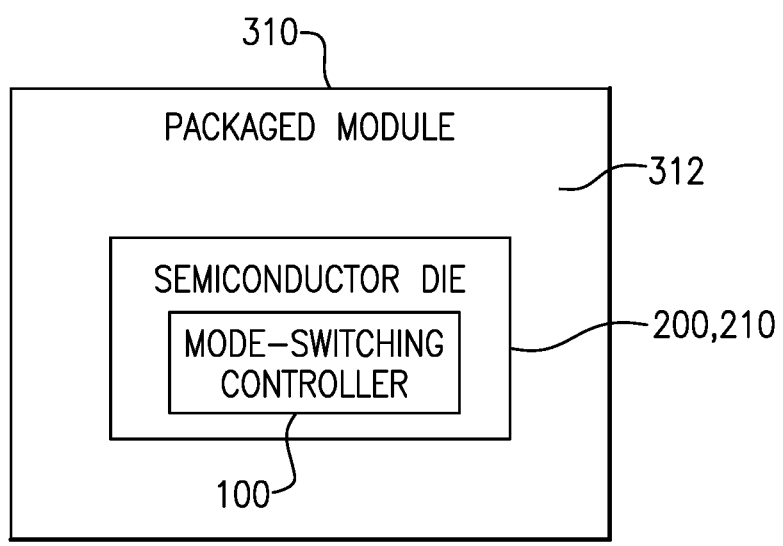
FIG. 20 shows that in some embodiments, a mode-switching controller having one or more features as described herein can be implemented on one or more semiconductor die, and such die can be mounted on the packaging substrate of a module.

FIG. 19 shows that in some embodiments, a mode-switching controller 100 having one or more features as described herein can be implemented on a packaged module 300 having a packaging substrate 302. FIG. 20 shows that in some embodiments, a mode-switching controller 100 having one or more features as described herein can be implemented on one or more semiconductor die 200, 210, and such die can be mounted on the packaging substrate 302.

Figure 21:
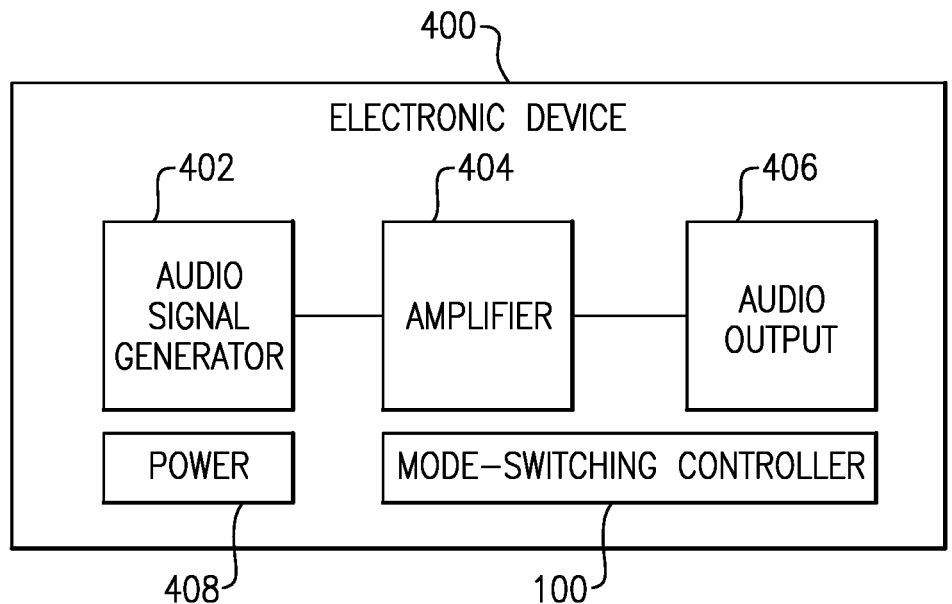
FIG. 21 shows that in some embodiments, an electronic device can include a mode-switching controller having one or more features as described herein.

FIG. 21 shows that in some embodiments, an electronic device 400 can include a mode-switching controller 100 having one or more features as described herein. Such an electronic device can include an amplifier 404 under the control of the mode-switching controller 100 as described herein. Such an amplifier can receive a signal to be amplified from an audio signal generator 402, and output an amplified audio signal to an audio output device 406. In the example of FIG. 15, the electronic device 400 can also include a power source 408 configured to provide power to various components, including the amplifier 404.

Figure 22:
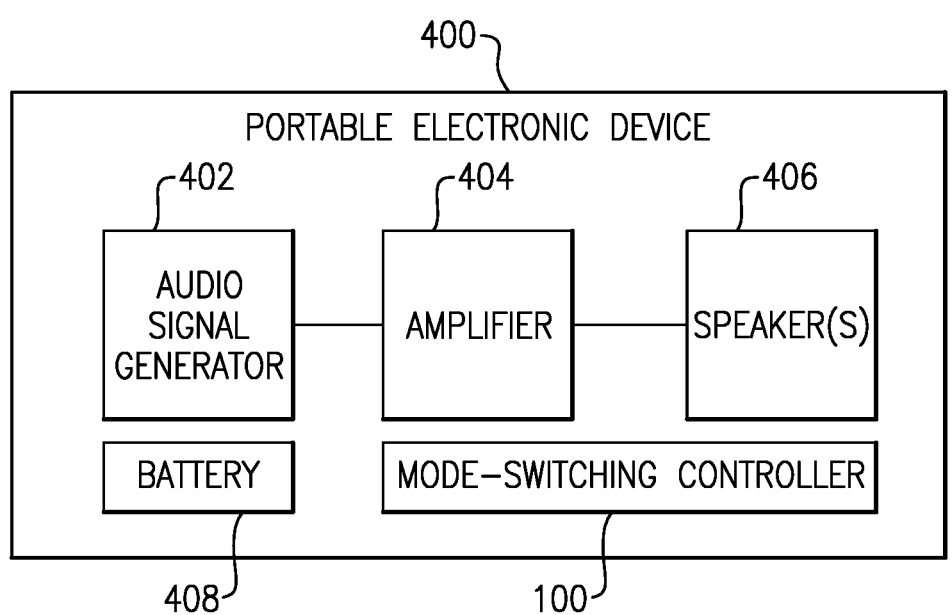
FIG. 22 shows a more specific example of the electronic device of FIG. 21.

FIG. 22 shows a more specific example of the electronic device 400 of FIG. 21. In FIG. 22, a portable electronic device 400 can include a mode-switching controller 100 having one or more features as described herein. Such an electronic device can include an amplifier 404 under the control of the mode-switching controller 100 as described herein. Such an amplifier can receive a signal to be amplified from an audio signal generator 402, and output an amplified audio signal to one or more speakers 406. In the example of FIG. 22, the electronic device 400 can also include a power source implemented in the form of a battery 408; and such battery can provide power to various components, including the amplifier 404.

In some implementations, the portable electronic device 400 of FIG. 22 can be, for example, a cellular phone, a smart-phone, a hand-held wireless device with or without phone functionality, a wireless tablet, etc.

It is noted that an electronic device can include a plurality of audio channels (with corresponding speakers) to provide, for example, stereo functionality. In some embodiments, a mode-switching controller 100 having one or more features as described herein can be configured to support switching of, for example, left and right audio channels at the same time to minimize or reduce stereo stage balance issues.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An audio controller comprising:
a mode state engine configured to receive an enable signal and generate a control signal for controlling a mode transition of an amplifier between a current source mode and a voltage source mode, the mode transition of the amplifier resulting in an artifact sound; and
an enable component configured to provide the enable signal to the mode state engine based on a masking sound in an audio signal, such that the artifact sound is substantially masked by the masking sound during the mode transition of the amplifier.

2. The audio controller of claim 1 wherein the enable component is configured such that the masking sound is selected to be spectrally similar to the artifact sound.

3. The audio controller of claim 2 wherein the enable component is configured such that the masking sound is identified based on a comparison of a crest factor of the audio signal and a crest factor threshold level.

4. The audio controller of claim 3 wherein the crest factor of the audio signal includes a high frequency crest factor.

5. The audio controller of claim 4 wherein the enable component includes a comparator configured to generate an output based on a comparison of the high frequency crest factor and the crest factor threshold level, the enable component further including a high pass filter and an absolute value circuit, such that the audio signal passed through the high pass filter and the absolute value circuit provides the high frequency crest factor.

6. The audio controller of claim 3 wherein the crest factor of the audio signal is obtained by a combination of a peak audio level of the audio signal and an average audio level of the audio signal.

7. The audio controller of claim 6 wherein the peak audio level and the average audio level are obtained from a common frequency range.

8. The audio controller of claim 7 wherein the common frequency range includes a frequency associated with the artifact sound.

9. The audio controller of claim 6 wherein the peak audio level is obtained from a first frequency range, and the average audio level is obtained from a second frequency range that is different than the first frequency range.

10. The audio controller of claim 9 wherein the first frequency range includes a frequency associated with the artifact sound.

11. The audio controller of claim 10 wherein the second frequency range includes a frequency range outside of the first frequency range.

12. The audio controller of claim 11 wherein the second frequency range includes a low frequency range.

13. The audio controller of claim 9 wherein the peak audio level is obtained by passing the audio signal through a peak level circuit that includes a high pass filter.

14. The audio controller of claim 9 wherein the average audio level is obtained by passing the audio signal through an average level circuit that includes an absolute value circuit.

15. The audio controller of claim 1 further comprising a target mode component configured to identify a target mode for the mode transition among a plurality of modes including the current source mode and the voltage source mode.

16. The audio controller of claim 15 wherein the target mode component is configured such that the target mode is identified based on an average audio signal level and threshold levels associated with the current source mode and the voltage source mode.

17. The audio controller of claim 1 further comprising a low audio component configured to identify a low audio condition that provides a reduced level of the artifact sound when the mode transition occurs during the low audio condition.

18. The audio controller of claim 1 wherein the mode state engine is further configured to support a change in output resistance of the amplifier in one or more steps.

19. A packaged module comprising:
a packaging substrate; and
an audio controller implemented on the packaging substrate and including a mode state engine configured to receive an enable signal and generate a control signal for controlling a mode transition of an amplifier between a current source mode and a voltage source mode, the mode transition of the amplifier resulting in an artifact sound, the audio controller further including an enable component configured to provide the enable signal to the mode state engine based on a masking sound in an audio signal, such that the artifact sound is substantially masked by the masking sound during the mode transition of the amplifier.

20. An electronic device comprising:
an amplifier configured to amplify an audio signal; and
an audio controller implemented to control the amplifier, the audio controller including a mode state engine configured to receive an enable signal and generate a control signal for controlling a mode transition of the amplifier between a current source mode and a voltage source mode, the mode transition of the amplifier resulting in an artifact sound, the audio controller further including an enable component configured to provide the enable signal to the mode state engine based on a masking sound in an audio signal, such that the artifact sound is substantially masked by the masking sound during the mode transition of the amplifier.

* * * * *